(12) United States Patent
Onodera

(10) Patent No.: US 7,521,821 B2
(45) Date of Patent: Apr. 21, 2009

(54) CIRCUIT APPARATUS AND FABRICATION METHOD FOR CIRCUIT APPARATUS

(75) Inventor: Takeshi Onodera, Kanagawa (JP)

(73) Assignee: Sony Corporation, Tokyo (JP)

( * ) Notice: Subject to any disclaimer, the term of this patent is extended or adjusted under 35 U.S.C. 154(b) by 345 days.

(21) Appl. No.: 11/591,994

(22) Filed: Nov. 1, 2006

(65) Prior Publication Data

US 2007/0103003 A1 May 10, 2007

(30) Foreign Application Priority Data

Nov. 7, 2005 (JP) ............................ P2005-322205

(51) Int. Cl.
*H02J 7/00* (2006.01)
(52) U.S. Cl. ....................................................... 307/64
(58) Field of Classification Search ................. 307/64
See application file for complete search history.

(56) References Cited

U.S. PATENT DOCUMENTS 7,411,412 B2 * 8/2008 Arakawa et al. ............. 326/10

FOREIGN PATENT DOCUMENTS

JP 3192220 10/1994
JP 3491579 5/2001

* cited by examiner

*Primary Examiner*—Robert L. DeBeradinis
(74) *Attorney, Agent, or Firm*—Robert J. Depke; Rockey, Depke & Lyons, LLC

(57) ABSTRACT

Disclosed herein is a circuit apparatus including: plural modules having functions which can be substituted for each other; a function allocation section configured to set a one-on-one corresponding relationship between a plurality of predetermined functions and the plural modules in response to a control signal inputted thereto and allocate the functions coordinated in accordance with the one-on-one relationship individually to the modules; and first power inputting sections configured to input power supplies to be supplied to the modules. The apparatus further includes: second power inputting sections configured to input power supplies each corresponding to at least one of the functions; and a connection section configured to connect at least some of the first power inputting sections and the second power inputting sections so that each of the power supplies inputted by the second power inputting sections is supplied to that one of the modules to which a function corresponding to the power supply is allocated.

11 Claims, 17 Drawing Sheets

F I G . 1 3
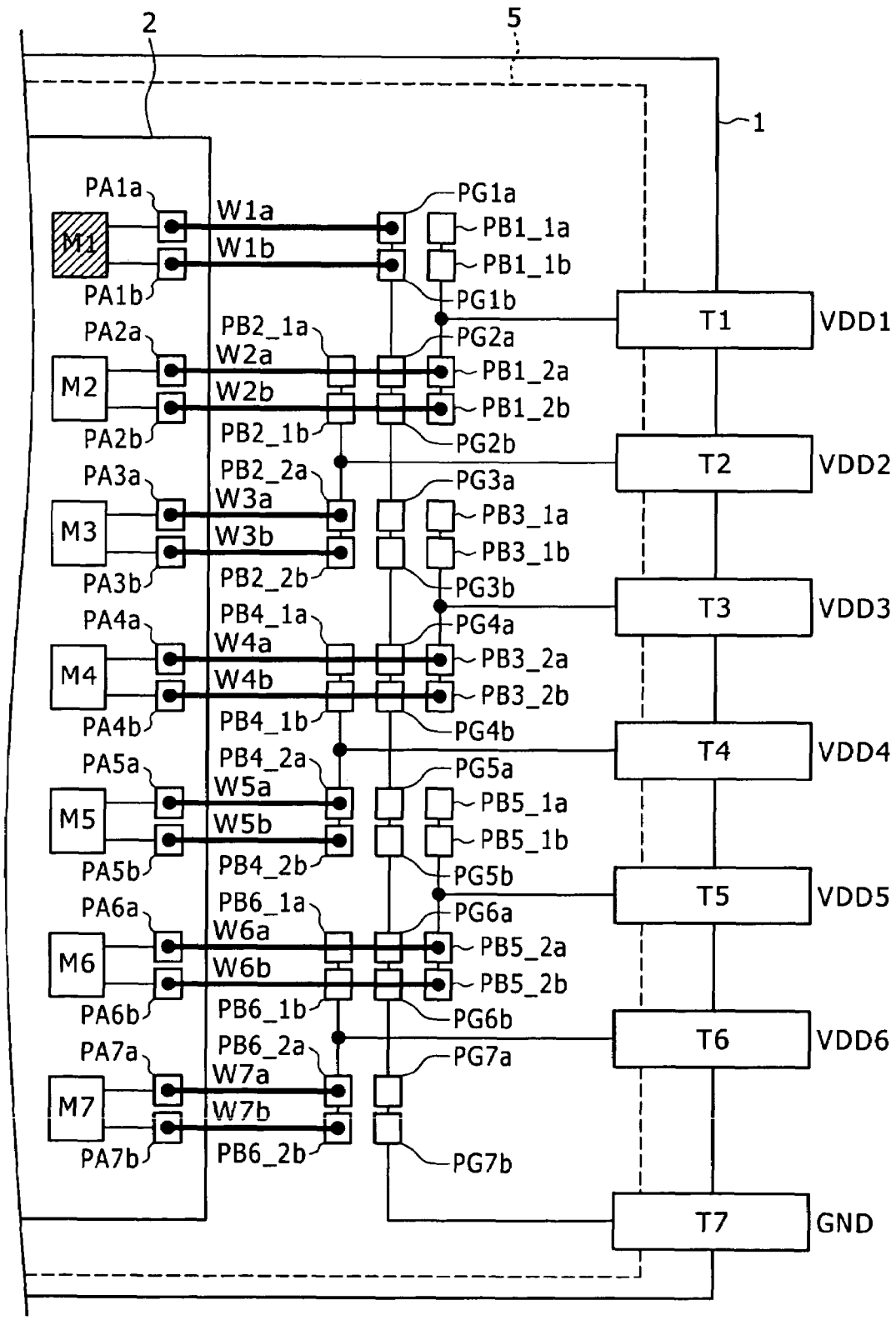

CIRCUIT APPARATUS AND FABRICATION METHOD FOR CIRCUIT APPARATUS

CROSS REFERENCES TO RELATED APPLICATIONS

The present invention contains subject matter related to Japanese Patent Application JP 2005-322205, filed in the Japanese Patent Office on Nov. 7, 2005, the entire contents of which being incorporated herein by reference.

BACKGROUND OF THE INVENTION

1. Field of the Invention

This invention relates to a semiconductor integrated circuit having a plurality of modules whose functions can be alternatively exchanged for each other and a fabrication method for a semiconductor integrated circuit, and more particularly to recovery of decrease of the yield arising from a fault of a module in a semiconductor integrated circuit and a fabrication method for the semiconductor integrated circuit.

2. Description of the Related Art

In a semiconductor integrated circuit in recent years, refinement in working dimension and increase in scale of a circuit configuration have proceeded remarkably, and decrease of the yield arising from a fault in fabrication is getting serious. Since there is a limit to recovery of such decrease of the yield as just described only by optimization of fabrication conditions, a relief method against a fault using a redundant circuit has been and is being used. According to this method, a redundant circuit is provided in advance at part of an entire circuit and a fault portion is replaced by the redundant circuit thereby to prevent an entire semiconductor chip from becoming defective.

For example, a logic circuit data production method for an FPGA (field programmable gate array) is disclosed in Japanese Patent No. 3491579 (hereinafter referred to as Patent Document 1). According to the logic circuit data production method, the necessity for fault avoidance is decided from fault information and logic information and, where fault avoidance is necessary, the logic information is modified so that a function of the fault portion is substituted by a free portion.

A semiconductor apparatus is disclosed in Japanese Patent No. 3192220 (hereinafter referred to as Patent Document 2). According to the semiconductor apparatus, data transfer between a plurality of modules is performed by addressing of the memory map type. An ID code is allocated to each of circuit modules, and, the ID code is operated to control a transfer destination of data thereby to replace a fault circuit module by a redundant circuit module.

On the other hand, in recent years, the proportion of leakage power which occupies in entire power consumption of a semiconductor integrated circuit has been and is increasing radically, and a leakage power reduction technique using a power gate or a like element has been developed and has begun to be utilized. The power gate is a transistor for changing over the power supply between on and off and controls the power supply to any non-used module to an off state during operation of a system to decrease uselessness leakage power which is consumed otherwise where the power to the non-used module is controlled to an on state.

Further, since a dispersion of a fabrication process has become to have a significant influence on power consumption, also adjustment of the power supply voltage is performed for each of IC chips. For example, the power supply voltage to an IC chip which operates at a high speed is decreased while the power supply voltage to an IC chip which operates at a low speed is increased to establish the balance between the working speed of the IC chip and the power consumption and achieve reduction of power consumption. Also it is examined to dynamically change the power supply voltage in response to an operation state of the IC chip.

SUMMARY OF THE INVENTION

Incidentally, if the relief method against a fault which adopts a redundant circuit and the power consumption reduction technique which adopts a power gate and a power supply voltage control process are combined with each other, then this gives rise to such a new subject as described below.

Since a non-used module isolated from a system by the fault relief method which adopts a redundant circuit does not take part in action of the entire apparatus at all, it is preferable to normally keep the power supply to the non-used module in an off state. Where a power gate is provided for each of power supply lines to modules, only the power gate corresponding to each non-used module should normally be kept in an off state. However, since which one of modules should be placed in a non-used state differs among different IC chips, it is necessary to retain the information regarding the non-used module in each of IC chips using, for example, a fuse. Since a fuse is much greater than a circuit device such as a transistor, if the fuse is formed on an IC chip, then the size of the chip increases significantly. Further, a step for exclusive use of cutting the fuse is required, and this increases a fabrication step.

On the other hand, if power supply lines of the modules are individually connected to power supply pins, then changeover between on and off of the power supply to the modules can be controlled through the power supply pins from the outside of the IC chips. Therefore, such a power gate or a fuse as described above need not be provided. However, in this instance, since a non-used module differs among different IC chips, the power supply pin the power supply to which is to be switched off differs among different IC chips. As a result, on and off states of the power supply to be inputted to the power supply pins must be set individually for different IC chips in a set substrate on which the IC chips are to be mounted, and hardware for exclusive use therefor and a surplus fabrication step are required.

Also where the power supply voltage to the modules is dynamically controlled in response to operation states of the modules, a subject similar to that described above occurs. In particular, since a function to be allocated to each module differs among different IC chips depending upon the relief method against a fault which adopts a redundant circuit, a corresponding relationship between the power supply pins and the functions of the modules differs among different IC chips. As a result, a control method for the power supply voltage to the power supply pins must be made different among the different IC chips on the set substrate, and hardware for exclusive use therefor and a surplus fabrication step are required.

Further, since, where the power supply is switched off or the power supply voltage is controlled outside the IC ships as described above, a circuit therefor must be provided for all of the power supply pins of the modules including redundant modules, this increases the circuit scale.

Therefore, it is desirable to provide a circuit apparatus in which the power supply to be supplied to each module can be controlled appropriately in response to a function to the module while suppressing increase of a production step or increase of the circuit scale and a fabrication method for the circuit apparatus.

According to an embodiment of the present invention, there is provided a circuit apparatus. The apparatus includes: a plurality of modules having functions which can be substituted for each other; and a function allocation section configured to set a one-on-one corresponding relationship between a plurality of predetermined functions and the plural modules in response to a control signal inputted thereto and allocate the functions coordinated in accordance with the one-on-one relationship individually to the modules. The apparatus further includes: a plurality of first power inputting sections configured to input power supplies to be supplied to the modules; and a plurality of second power inputting sections configured to input power supplies each corresponding to at least one of the functions. The apparatus still further includes a connection section configured to connect at least some of the first power inputting sections and the second power inputting sections so that each of the power supplies inputted by the second power inputting sections is supplied to that one of the modules to which a function corresponding to the power supply is allocated.

Preferably, the function allocation section allocates a redundant function to at least one of the modules, and the connection section connects that one of the first power inputting sections which is used to input a power supply to the module to which the redundant function is allocated to a reference potential line.

According to another embodiment of the present invention, there is provided a fabrication method for a circuit apparatus. The method includes a first step of forming, on a common substrate or a plurality of substrates, a plurality of modules having functions which can be substituted for each other, a function allocation section configured to set a one-on-one corresponding relationship between a plurality of predetermined functions and the plural modules in response to a control signal inputted thereto and allocate the functions coordinated in accordance with the one-on-one relationship individually to the modules, and a plurality of first power inputting sections configured to input power supplies to be supplied to the modules. The method further includes a second step of forming a plurality of second power inputting sections each configured to input a power supply corresponding to at least one of the functions on the common substrate or the substrates, and a third step of inspecting the modules formed at the first step and determining functions to be allocated to the modules by the function allocation section in response to a result of the inspection. The method still further includes a fourth step of forming a connection section configured to interconnect at least some of the first power inputting sections and the second power inputting sections so that each of the power supplies inputted by the second power inputting sections is supplied to a module to which a function corresponding to the power supply is allocated based on the function allocation to the modules determined at the third step.

Preferably, the function allocation section is formed at the first step so that a redundant function is allocated to at least one of the modules, and the connection section is formed at the fourth step so that one of the first power inputting sections which is for inputting a power supply to the module to which the redundant function is allocated is connected to a predetermined reference potential line.

With the circuit apparatus and the fabrication method therefor, power inputting sections for inputting power supplies to be supplied to individual modules and power inputting sections for inputting power supplies corresponding to individual functions are connected in response to the functions to be allocated to the modules. Consequently, the power supplies to be supplied to the modules can be controlled appropriately in response to the functions to be allocated to the modules without adding a special fabrication step or without providing a complicated circuit.

The features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 12 to 15 are schematic views showing different modifications to the circuit apparatus shown in FIG. 1;

DETAILED DESCRIPTION OF THE PREFERRED EMBODIMENT

Figure 1:
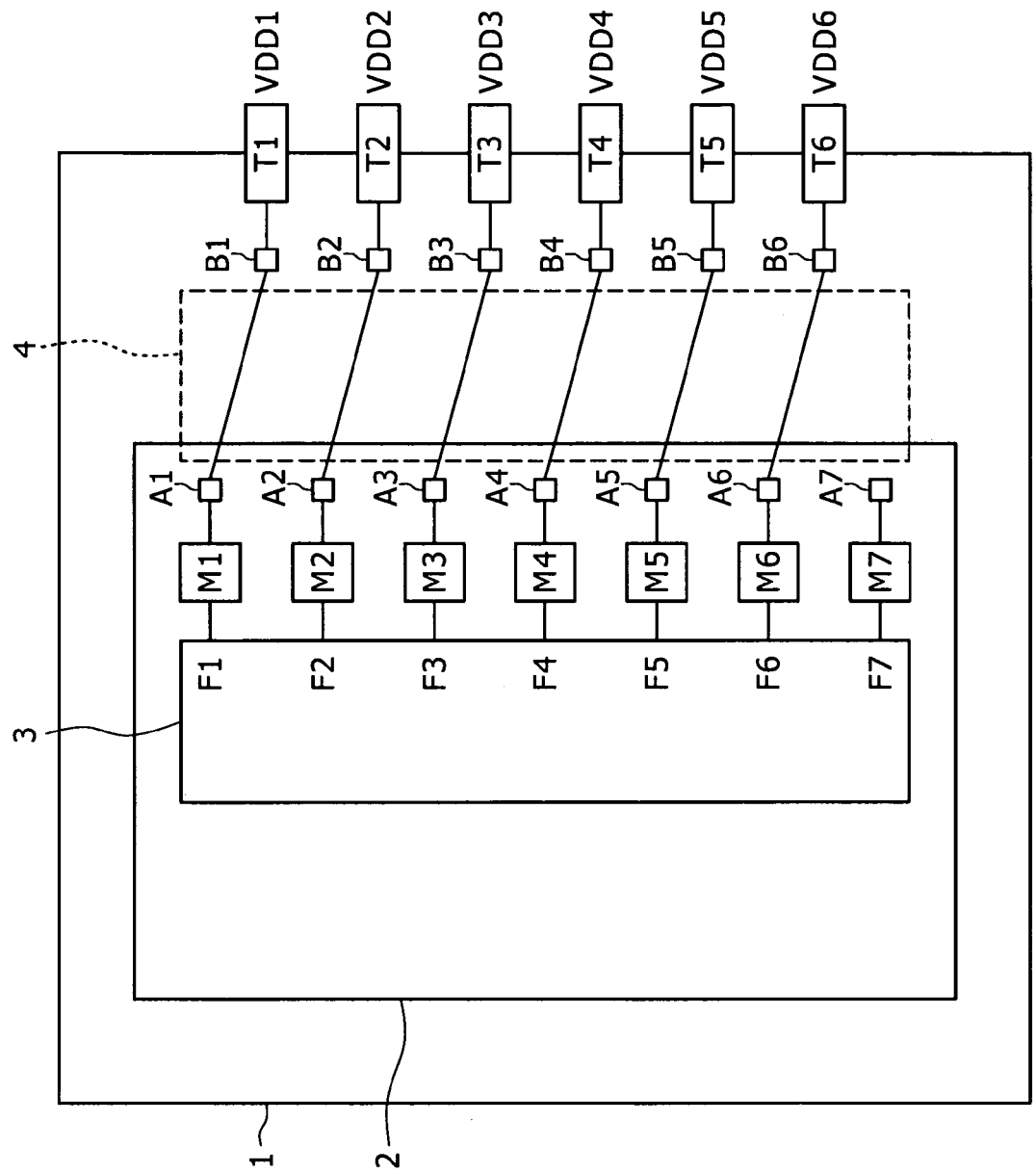
FIG. 1 is a block diagram showing an example of a configuration of a circuit apparatus to which the present invention is applied.

FIG. 1 shows an example of a configuration of a circuit apparatus to which the present invention is applied.

Referring to FIG. 1, the circuit apparatus 1 shown includes an IC chip 2, a connection section 4, second power inputting sections B1 to B6, and terminals T1 to T6. A semiconductor substrate (not shown) of the IC chip 2 has a function allocation section 3, modules M1 to M7 and first power inputting sections A1 to A7 formed thereon.

Each of the modules M1 to M7 is a form of a module according to an embodiment of the present invention.

The function allocation section 3 is a form of a function allocation section according to an embodiment of the present invention.

Each of the first power inputting sections A1 to A7 is a form of a first power inputting section according to an embodiment of the present invention.

Each of the second power inputting sections B1 to B7 is a form of a second power inputting section according to an embodiment of the present invention.

The connection section 4 is a form of a connection section according to an embodiment of the present invention.

It is to be noted that, in FIG. 1, circuits and terminals for signal inputting and outputting of the IC chip 2 are not shown.

Each of the modules M1 to M7 is a unit of circuitry having a predetermined function and can exchange the function with any other one of the modules M1 to M7. Although all of the module M1 to M7 may have the same circuit configuration, alternatively any of the modules M1 to M7 may have a different circuit configuration from the other modules only if it can exchange the function with the other modules.

The circuit configuration and functions of the modules M1 to M7 can be set arbitrarily. For example, a circuit having an arithmetic operation and processing function such as a DSP (digital signal processor) may be used, or a circuit which performs comparatively simple logical arithmetic operation such as a lookup table may be used. Alternatively, a plurality of circuits having functions equivalent to those included in the circuit apparatus may individually be handled as a module.

Further, the modules M1 to M7 are not limited to digital circuits but may be analog circuits.

The function allocation section 3 sets a one-on-one relationship between seven functions F1 to F7 determined in advance and the modules M1 to M7 in response to a control signal inputted thereto and allocates the functions in the one-on-one coordinated relationship to the modules M1 to M7. In the example of FIG. 1, the functions F1 to F7 are allocated to the modules M1 to M7, respectively. As the modules M1 to M7 take charge of the functions F1 to F7, entire functions or part of functions of the IC chip 2 are implemented.

The seven functions F1 to F7 allocated to the modules M1 to M7 may include a redundant function. In particular, the function allocation section 3 may allocate a redundant function to at least one of the modules M1 to M7.

Here, the "redundant function" is a function which is not absolutely necessary for the entire functions of the IC chip 2. A module to which the redundant function is allocated does not have an influence on the entire functions of the IC chip 2 even if the power supply to the module is turned off.

A circuit to which the redundant function is allocated is set to a state wherein no signal is inputted thereto, for example, from any other circuit of the IC chip 2 and no signal is outputted to any other different circuit at all.

Accordingly, if the redundant function is allocated to a module which has a fault, then the entire functions of the IC chip 2 can be maintained and recovery of the fault of the module can be implemented.

In the example of FIG. 1, 'F7' denotes the redundant function, and no power is supplied to the module to which the function F7 is allocated.

Figure 2:
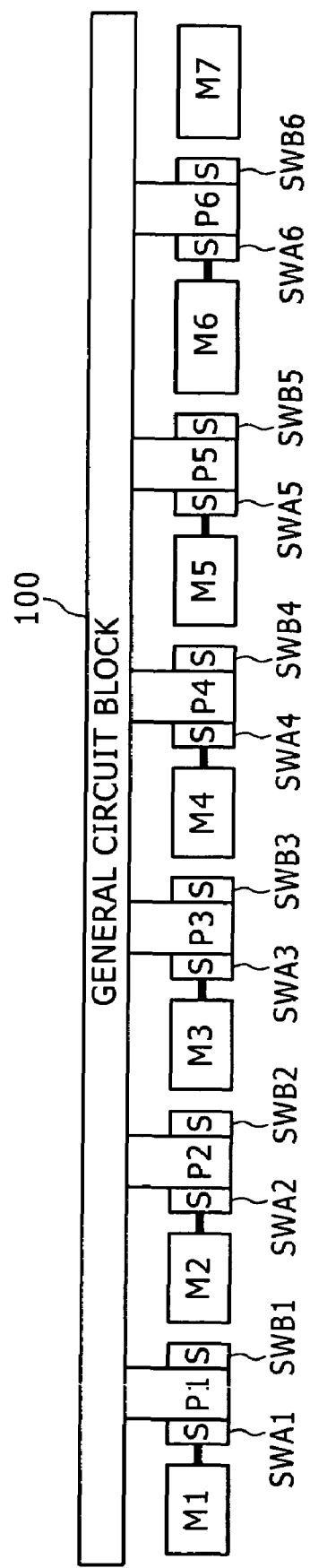
FIG. 2 is a diagrammatic view showing a configuration of an IC chip in the circuit apparatus of FIG. 1.
Figure 3:
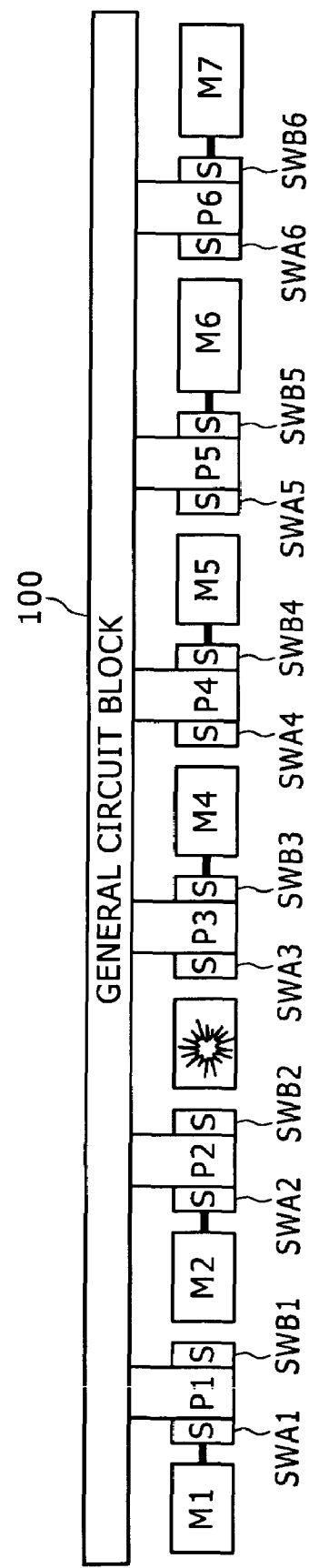
FIG. 3 is a diagrammatic view showing an example of a connection state between modules and input/output sections of the IC chip of FIG. 2 where a particular one of the modules is in a fault state.
Figure 4:
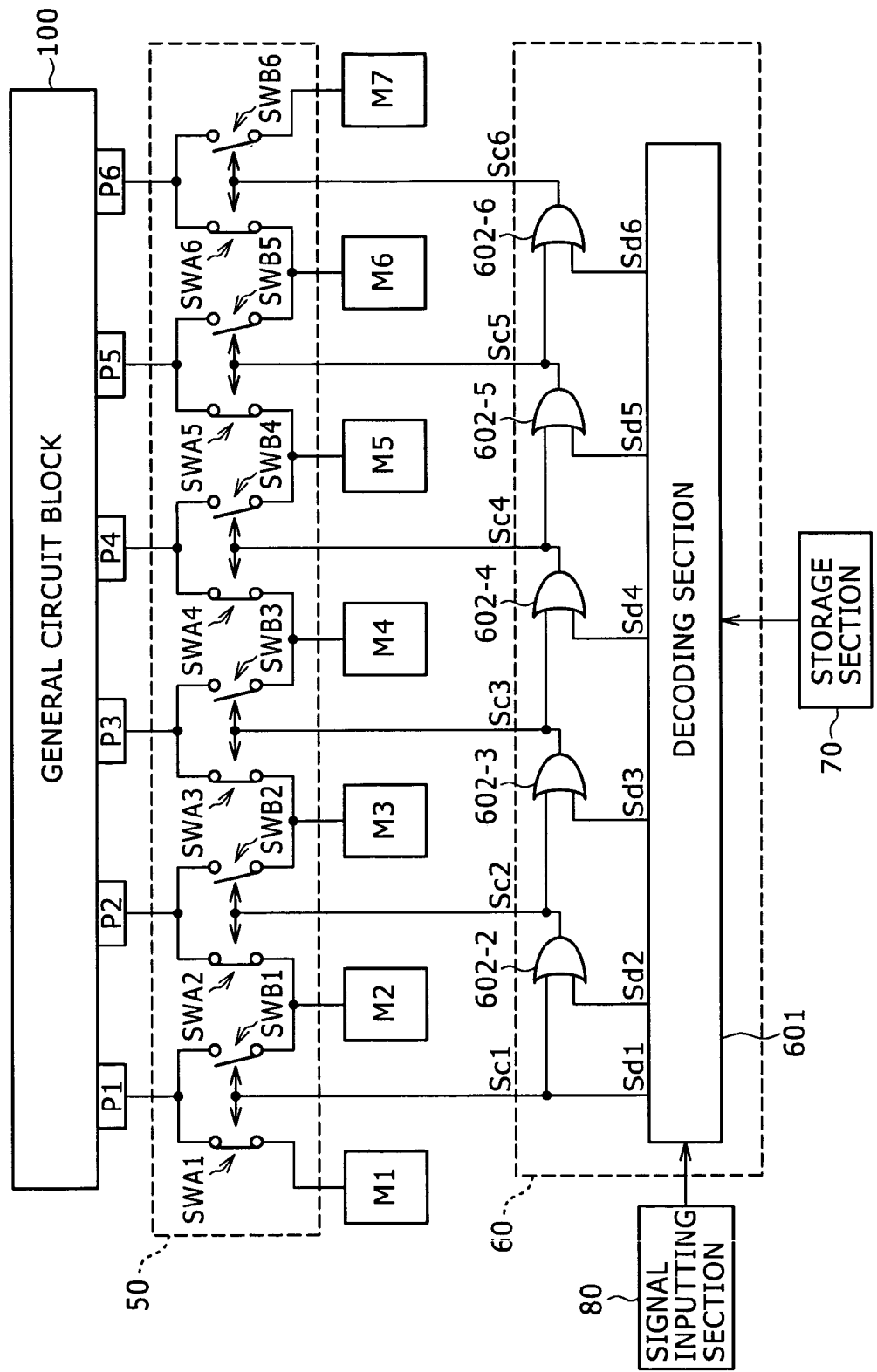
FIG. 4 is a block diagram showing an example of a detailed configuration of the IC chip shown in FIG. 1.

Changing of allocation of the functions by the function allocation section 3 can be implemented by various methods. For example, as shown in FIGS. 2 to 4, the allocation changing of the functions to the modules may be performed by changing over the connection scheme to the other circuits in the IC chip 2. Where the modules are programmable circuits, the changing of the functions may be performed by performing not only the changeover of the connection scheme described above but also changing of programs of the modules. Further, where a plurality of modules communicate with each other through a common bus, the changing of the functions of the modules may be performed by changing information (IDs) for identifying the individual modules on the bus. Further, use of a module having a fault may be avoided using software based on information (ID) for identifying the module.

A first power inputting section An ('n' indicates an integer from 1 to 7) inputs power to be supplied to the module An.

The first power inputting section An includes, for example, a conductor pad, and inputs power supplied from the outside of the IC chip 2 through a conductor line bonded to the pad.

A second power inputting section Bi ('i' indicates an integer from 1 to 6) inputs a power supply voltage VDDi corresponding to a function Fi. The power supply voltage VDDi is a power supply voltage to be supplied to the module to which the function Fi is allocated by the function allocation section 3. The power supply voltage VDDi is applied to a terminal Ti from the outside of the circuit apparatus 1. The second power inputting section Bi inputs the power supply voltage VDDi from the terminal Ti.

The second power inputting section Bi is formed, for example, on an interposer substrate, and is electrically connected to the terminal Ti through a fixed wiring line on the interposer substrate.

Further, the second power inputting section Bi includes, for example, a conductor pad formed on the interposer substrate, and supplies the power supply voltage VDDi to the module having the function Fi formed on the semiconductor substrate of the IC chip 2 through a conductor wiring wire bonded to the pad.

The connection section 4 connects some of the first power inputting sections A1 to A7 and the second power inputting sections B1 to B6 to each other so that the power supply voltage VDDi inputted to the power inputting section Bi is supplied to the module to which the function Fi is allocated.

The connection section 4 is formed, for example, from conductor lines such as, for example, thin gold lines for connecting the pads of the first power inputting sections A1 to A7 formed on the semiconductor substrate and the pads of the second power inputting sections B1 to B6 formed on the interposer substrate to each other by means of bonded wires.

It is to be noted that the connection section 4 may connect a predetermined reference potential line (ground line) to the first power inputting section corresponding to the module to which the redundant function F7 is allocated by the function allocation section 3. For example, in the example of FIG. 1, a ground line may be connected to the first power inputting section A7 for inputting power supply to the module M7 to which the function F7 is allocated. Consequently, the potential of the power supply line to the module to which the redundant function is allocated can be stabilized, and therefore, production of noise can be suppressed.

Now, an example of a detailed configuration of the IC chip 2 is described with reference to FIGS. 2 to 4.

FIG. 2 shows an example of a configuration of the IC chip 2.

For example, as shown in FIG. 2, the IC chip 2 includes modules M1 to M7, a general circuit block 100, and switch circuits SWA1 to SWA6 and SWB1 to SWB6.

The modules M1 to M7 in the FIG. 2 are components same as those denoted by the same reference characters in FIG. 1.

The general circuit block 100 is a form of a circuit block according to an embodiment of the present invention.

A circuit including the switch circuits SWA1 to SWA6 and SWB1 to SWB6 corresponds to the function allocation section 3 in FIG. 1, and is a form of a module selection section according to an embodiment of the present invention.

The general circuit block 100 includes inputting and outputting portions P1 to P6 for transmitting and receiving a signal to and from the modules M1 to M7, and cooperated with the modules to execute a predetermined process. The circuit configuration and functions of the general circuit block 100 can be set arbitrarily, and the general circuit block 100 may be formed, for example, only from wiring lines.

The inputting and outputting portions P1 to P6 individually output at least one signal to one of the modules M1 to M7 described above, and/or individually input at least one signal generated in the one of the modules.

All of the inputting and outputting portions P1 to P6 may input and output signals of the same combination, or may include a different inputting and outputting portion for inputting and outputting signals of a different combination.

For example, where the modules M1 to M7 include three output terminals, an inputting and outputting portion for inputting a signal from all of the three outputting terminals, another inputting and outputting portion for inputting a signal only from one of the outputting terminals and so forth may be included.

A switch circuit SWAi ($1 \leq i \leq 6$) is connected between an inputting and outputting portion Pi and a module Mi, and is switched on or off in response to a control signal (not shown) inputted thereto.

A switch circuit SWBi is connected between the inputting and outputting portion Pi and the module M(i+1), and is switched on or off in response to a control signal inputted thereto.

The switch circuits SWA1 to SWA6 and SWB1 to SWB6 form the module selection section.

Here, the module selection section (SWA1 to SWA6 and SWB1 to SWB6) having a function of selecting six modules from among the seven modules (M1 to M7) in response to a control signal and connecting the six selected modules and the six inputting and outputting portions (P1 to P6) in an one-on-one relationship to each other.

The module selection section (SWA1 to SWA6 and SWB1 to SWB6) connects one of the two modules selected in response to the control signal individually to the six inputting and outputting portions. In particular, one of the modules Mi and M(i+1) is selected in response to the inputted control signal, and the selected module is connected to the inputting and outputting portion Pi.

The module selection section (SWA1 to SWA6 and SWB1 to SWB6) selects six modules from among the seven modules such that a fault module from among the seven modules is disconnected from all inputting and outputting portions in response to a control signal supplied thereto from the control section not shown. If the seven modules include no fault module, then a module provided for redundancy in advance is selected.

For example, where a control signal representing that a module Mn ($1 \leq n \leq 7$) should be disconnected from all inputting and outputting portions, if n is one of integers from 2 to 6, or in other words, if one of the modules M2 to M6 is to be disconnected, then the switch circuits SWA1 to SWA(n−1) are switched on and the switch circuits SWAn to SWA6 are switched off while the switch circuits SWB1 to SWB(n−1) are switched off and the switch circuits SWBn to SWB6 are switched on. If n is an integer 1, or the module M1 is to be disconnected, then the switch circuits SWA1 to SWA6 are all switched off and the switch circuits SWB1 to SWB6 are all switched on. If n is an integer 7, or the module M7 is to be disconnected, then the switch circuits SWA1 to SWA6 are all switched on and the switch circuits SWB1 to SWB6 are all switched on.

FIG. 3 illustrates a connection state where a fault occurs with the module M3. In this instance, the control section not shown produces a control signal so that the module M3 should be disconnected from all inputting and outputting portions.

In response to the control signal, the switch circuits SWA1 and SWA2 are switched on; the switch circuits SWA3, SWA4, SWA5 and SWA6 are switched off; the switch circuits SWB1 and SWB2 are switched off; and the switch circuits SWB3, SWB4, SWB5 and SWB6 are switched on.

Consequently, the inputting and outputting portion P1 and the module M1, the inputting and outputting portion P2 and the module M2, the inputting and outputting portion P3 and the module M4, the inputting and outputting portion P4 and the module M5, and the inputting and outputting portion P5 and the module M6, and the inputting and outputting portion P6 and the module M7 are connected to each other. Meanwhile, the module M3 is disconnected from the general circuit block 100.

It is to be noted that the functions (F1 to F7) allocated to the modules of the IC chip 2 shown in FIG. 1 and the inputting and outputting portions connected to the modules of the IC chip 2 shown in FIG. 2 have such a relationship as described below.

In particular, the module to which the function Fi ($1 \leq i \leq 6$) is allocated in the IC chip 2 shown in FIG. 1 is connected to the inputting and outputting portion Pi in the IC chip 2 shown in FIG. 2. The module to which the redundant function F7 is allocated in the IC chip 2 is disconnected from all inputting and outputting portions (P1 to P6) of the IC chip 2 shown in FIG. 2.

Accordingly, one of the functions F(j−1), Fj and F7 is allocated to a module Mj ('j' indicates an integer from 2 to 6) of the IC chip 2 shown in FIG. 1. Meanwhile, the function F1 or F7 is allocated to the module M1, and the function F6 or F7 is allocated to the module M7.

Further, the power supply voltage VDDi is supplied to a module (Mi or M(i+1)) connected to the inputting and outputting portion Pi.

FIG. 4 shows an example of a more detailed configuration of the IC chip 2. The same notations in FIG. 4 and FIG. 2 indicate the same components.

Referring to FIG. 4, the IC chip 2 shown includes modules M1 to M7, a general circuit block 100 having inputting and outputting portions P1 to P6, a module selection section 50, a control section 60, a storage section 70, and a signal inputting section 80.

The module selection section 50 is a form of a module selection section according to an embodiment of the present invention.

A circuit which includes the module selection section 50 and the control section 60 corresponds to the function allocation section 3 shown in FIG. 1.

The module selection section 50 selects six modules from among the modules M1 to M7 in response to a control signal supplied thereto from the control section 60 and selects the six selected modules and the six inputting and outputting portions P1 to P6 of the general circuit block 100 in a one-on-one corresponding relationship to each other.

The module selection section 50 includes, for example, as shown in FIG. 4, switch circuits SWA1 to SWA6 and switch circuits SWB1 to SWB6.

The switch circuit SWAi ($1 \leq i \leq 6$) is connected between the inputting and outputting portion Pi and the module Mi and exhibits an on state when a control signal Sci supplied thereto has a value '0' but exhibits an off state when the control signal Sci has another value '1'.

The switch circuit SWBi is connected between the inputting and outputting portion Pi and the module M(i+1) and exhibits an off state when the control signal Sci has the value "0" but exhibits an on state when the control signal Sci has the value "1".

The switch circuit SWAi has at least one of a switch for switching on/off a signal to be transmitted from the inputting and outputting portion Pi to the module Mi and/or a switch for switching on/off a signal to be transmitted from the module Mi to the inputting and outputting portion Pi.

Similarly, the switch circuit SWBi has at least one of a switch for switching on/off a signal to be transmitted from the inputting and outputting portion Pi to the module M(i+1)

and/or a switch for switching on/off a signal to be transmitted from the module M(i+1) to the inputting and outputting portion Pi.

The control section 60 generates control signals Sc1 to Sc6 for controlling the module selection section 50. In particular, in a first operation mode, the control section 60 produces control signals Sc1 to Sc6 for disconnecting one of the modules which is designated by a signal inputted to the signal inputting section 80 from all of the inputting and outputting portions P1 to P6. On the other hand, in a second operation mode, the control section 60 produces control signals Sc1 to Sc6 for disconnecting one of the modules which is designated by information written in the storage section 70 from all of the inputting and outputting portions P1 to P6.

The control section 60 may recognize an operation mode by any method and, for example, may recognize an operation mode in response to a signal applied to a predetermined terminal or in response to the value of a flag written in the storage section 70.

The first operation mode is mainly set in case of inspection of the modules whereas the second operation mode is mainly set in normal state after completion of the inspection of the modules.

If the signal inputted from the signal inputting section 80 or the information written in the storage section 70 indicates disconnection of a module Mn ($1 \leq n \leq 7$) from all inputting and outputting portions, then the control section 60 outputs the following control signals Sc1 to Sc6 in response to the value of the integer n.

[In the Case of $2 \leq n \leq 6$]

In this instance, the control section 60 sets the control signals Sc1 to Sc(n−1) to the value '0' and sets the control signals Scn to Sc6 to '1'.

Consequently, the switch circuits SWA1 to SWA(n−1) are set to an on state; the switch circuits SWAn to SWA6 are set to an off state; the switch circuits SWB1 to SWB(n−1) are set to an off state; and the switch circuits SWBn to SWB6 are set to an on state. As a result, the modules M1 to M(n−1) are connected in a one-on-one corresponding relationship to the inputting and outputting portions P1 to P(n−1), and the modules M(n+1) to M7 are connected in a one-on-one corresponding relationship to the inputting and outputting portions P1 to P6. Further, the module Mn is disconnected from all inputting and outputting portions.

[In the Case of n=1]

In this instance, the control section 60 sets all of the control signals Sc1 to Sc6 to the value '1'.

Consequently, all switch circuits SWA1 to SWA6 are set to an off state and all switch circuits SWB1 to SWB6 are set to an on state. As a result, the modules M2 to M7 are connected in a one-on-one corresponding relationship to the inputting and outputting portions P1 to P6, and the module M1 is disconnected from all inputting and outputting portions.

[In the Case of n=7]

In this instance, the control section 60 sets all of the control signals Sc1 to Sc6 to the value '0'.

Consequently, all of the switch circuits SWA1 to SWA6 are set to an on state and all of the switch circuits SWB1 to SWB6 are set to an off state. As a result, the modules M1 to M6 are connected in a one-on-one corresponding relationship to the inputting and outputting portions P1 to P6, and the module M7 is disconnected from all inputting and outputting portions.

The control section 60 includes, for example, as shown in FIG. 4, a decoding section 601 and OR circuits 602-2 to 602-6.

The decoding section 601 decodes a signal inputted thereto from the storage section 70 or the signal inputting section 80 and outputs a result of the decoding as signals Sd1 to Sd6.

In particular, if the information stored in the storage section 70 or the signal inputted from the signal inputting section 80 indicates disconnection of a module Mn from all inputting and outputting portions, then the decoding section 601 produces the following signals Sd1 to Sd6 in response the value of the integer n.

If 'n' is an integer from 1 to 6, then a signal Sdn is set to '1' and the other signals are set to '0'.

If 'n' is the integer 7, then all of the signals Sd1 to Sd6 are set to '0'.

Since the signals Sd1 to Sd6 indicate whether the modules M1 to M7 are to be individually disconnected from all inputting and outputting portions, they are hereafter referred to as signals Sd1 to Sd6.

In the first operation mode (operation mode for module inspection), the decoding section 601 produces the signals Sd1 to Sd6 in response to a signal inputted thereto from the signal inputting section 80. In the second operation mode (operation mode after completion of a module inspection), the decoding section 601 produces the signals Sd1 to Sd6 in response to the information written in the storage section 70.

It is to be noted that the instruction signal Sd1 outputted from the decoding section 601 in the example of FIG. 4 is same as the control signal Sc1 supplied to the module selection section 50.

The OR circuits 602-2 to 602-6 are logical ORing arithmetic operation circuits each having two inputs and one output and are connected to each other in a cascade connection in this order.

The OR circuit 602-2 receives the instruction signal Sd1 (=control signal Sc1) at one of the two inputs thereof and receives the instruction signal Sd2 at the other input thereof. The output of the OR circuit 602-2 is supplied as the control signal Sc2 to the module selection section 50.

The OR circuit 602-k (k is an integer from 3 to 6) receives an output signal of the OR circuit 602-(k−1) at one of the two inputs thereof and receives the instruction signal Sdk at the other input thereof. The output of the OR circuit 602-k is supplied as the control signal Sck to the module selection section 50.

If the instruction signal Sdj (j is an integer from 2 to 6) of the decoding section 601 indicates the value '1', then the OR circuit 602-j to which the instruction signal Sdj is inputted outputs the control signal Scj having the value '1'. Where 'j' is smaller than 6, also the control signals Sc(j+1) to Sc6 outputted from the OR circuits 602-(j+1) to 602-6 at the succeeding stages to the OR circuit 602-j all indicate the value '1'.

If the instruction signal Sd1 (=control signal Sc1) of the decoding section 601 indicates the value '1', then the OR circuit 602-2 to which the instruction signal Sd1 is inputted outputs the control signal Sc2 of the value '1'. Also the control signals Sc3 to Sc6 outputted from the OR circuits 602-3 to 602-6 at the succeeding stages to the OR circuit 602-2 indicate the value '1'.

On the other hand, if all of the signals Sd1 to Sd6 of the decoding section 601 indicate the value '0', then the input and output signals of the OR circuits 602-2 to 602-6 all indicate the value '0', and consequently, all of the control signals Sc1 to Sc6 supplied to the module selection section 50 indicate the value '0'.

Accordingly, in a case wherein the module Mn is to be disconnected from all inputting and outputting portions, when 'n' is an integer from 2 to 6, the instruction signals Sd1 to Sd(n−1) are set to the value '0' and the instruction signal Sdn is set to the value '1' and the instruction signals Sd(n+1) to Sd6 are set to the value '0' by the decoding section 601. Consequently, the control signals Sc1 to Sc(n−1) have the value '0' and the control signals Scn to Sc6 have the value '1'. On the other hand, when 'n' is the integer 1, the instruction signal Sd1 is set to the value '1' by the decoding section 601, and consequently, the control signals Sc1 to Sc6 all have the value '1'. When 'n' is the integer 7, the signals Sd1 to Sd6 are all set to the value '0' by the decoding section 601, and consequently, the control signals Sc1 to Sc6 all have the value '0'.

The storage section 70 stores information which indicates that one of the seven modules M1 to M7 which is to be disconnected from all inputting and outputting portions P1 to P6.

The storage section 70 can be formed, for example, from a fuse element or a nonvolatile memory.

The signal inputting section 80 is provided to input a signal indicative of that one of the modules which is to be disconnected from all inputting and outputting portions P1 to P6 and is used in order to input a signal to the control section 60 from an external apparatus in such an instance that, for example, an inspection of the IC chip 2 is to be performed.

Description of the IC chip 2 is completed therewith.

Now, several examples of a detailed configuration of a portion for inputting power to the modules from the terminals T1 to T6 are described with reference to FIGS. 5 to 11.

In the examples of FIGS. 5 to 11, the circuit apparatus 1 has an interposer substrate 5, on which pads PB1_1 to PB6_1, PB1_2 to PB6_2, and PG1 to PG7 a reformed. Meanwhile, pads PA1 to PA7 are formed on the semiconductor substrate of the IC chip 2.

The pad PAn ($1 \leq n \leq 7$) is included in the first power inputting section An and connected to a power supply line to the module Mn.

The pads PBi_1 and PBi_2 ($1 \leq i \leq 6$) are included in the second power inputting section Bi and connected to the terminal Ti through a fixed wiring line formed on the interposer substrate 5.

The pads PG1 to PG7 are connected to the terminal T7 through a fixed wiring line formed on the interposer substrate 5 and set to a reference potential GND.

The pads PB1_1 to PB6_1, PB1_2 to PB6_2, and PG1 to PG7 of the interposer substrate 5 described above and the pads PA1 to PA7 of the IC chip 2 are selectively connected by conductor lines W1 to W7. The conductor lines W1 to W7 form the connection section 4 described hereinabove.

The conductor line W1 interconnects the pads PA1 and PB1_1 where the module M1 is connected to the inputting and outputting portion P1, that is, where the function F1 is allocated to the module M1. However, the conductor line W1 interconnects the pad PA1 and the pad PG1 where the module M1 is disconnected from the inputting and outputting portion P1, that is, where the redundant function F7 is allocated to the module M1.

The conductor line Wj ($2 \leq j \leq 6$) interconnects the pads PAj and PB(j−1)_2 where the module Mj is connected to the inputting and outputting portion P(j−1), that is, where the function F(j−1) is allocated to the module Mj. However, the conductor line Wj interconnects the pads PAj and PBj_1 where the module Mj is connected to the inputting and outputting portion Pj, that is, where the function Fj is allocated to the module Mj. However, the conductor line Wj interconnects the pads PAj and PGj where the module Mj is to be disconnected from all inputting and outputting portions, that is, where the function F7 is allocated to the module Mj.

The conductor line W7 interconnects the pads PA7 and PB6_2 where the module M7 is connected to the inputting and outputting portion P6, that is, where the function F6 is allocated to the module M7. However, the conductor line W7 interconnects the pads PA7 and PG7 where the module M7 is to be disconnected from the inputting and outputting portion P6, that is, where the function F7 is allocated to the module M7.

In the example of FIGS. 5 to 11, the pads (PB1_1 to PB6_1, PB1_2 to PB6_2 and PG1 to PG7) of the interposer substrate 5 and the pads (PA1 to PA7) of the IC chip 2 are arranged such that the conductor lines W1 to W7 which interconnect them may not intersect with each other.

The pads can be arranged, for example, in the following manner.

An entire set of the pads PB1_1 to PB6_1, PB1_2 to PB6_2 and PG1 to PG7 of the interposer substrate 5 and the pads PA1 to PA7 of the IC chip 2 is divided into seven partial sets corresponding to the modules M1 to M7.

The partial set (hereinafter referred to as first partial set) corresponding to the module M1 is composed of the pads PA7, PB1_1 and PG1.

The partial set (hereinafter referred to as jth partial set) corresponding the module Mj ($2 \leq j \leq 6$) is composed of the pads PAj, PB(j−1)_2, PBj_1 and PGj.

The partial set (hereinafter referred to as seventh partial set) corresponding to the module M7 is composed of the pads PA7, PB6_2 and PG7.

In the partial sets, one group of pad pairs in the maximum are interconnected by a conductor wire (W1 to W7). For example, in the second partial set, the pads PA2 and PB2_1, pads PA2 and PG2 or pads PA2 and PB1_2 are interconnected by the conductor line W2, but two or more groups of pad pairs are never connected at the same time.

Further, pads which belong to the same partial set and a conductor line which interconnects them are arranged on the same plane.

Figure 5:
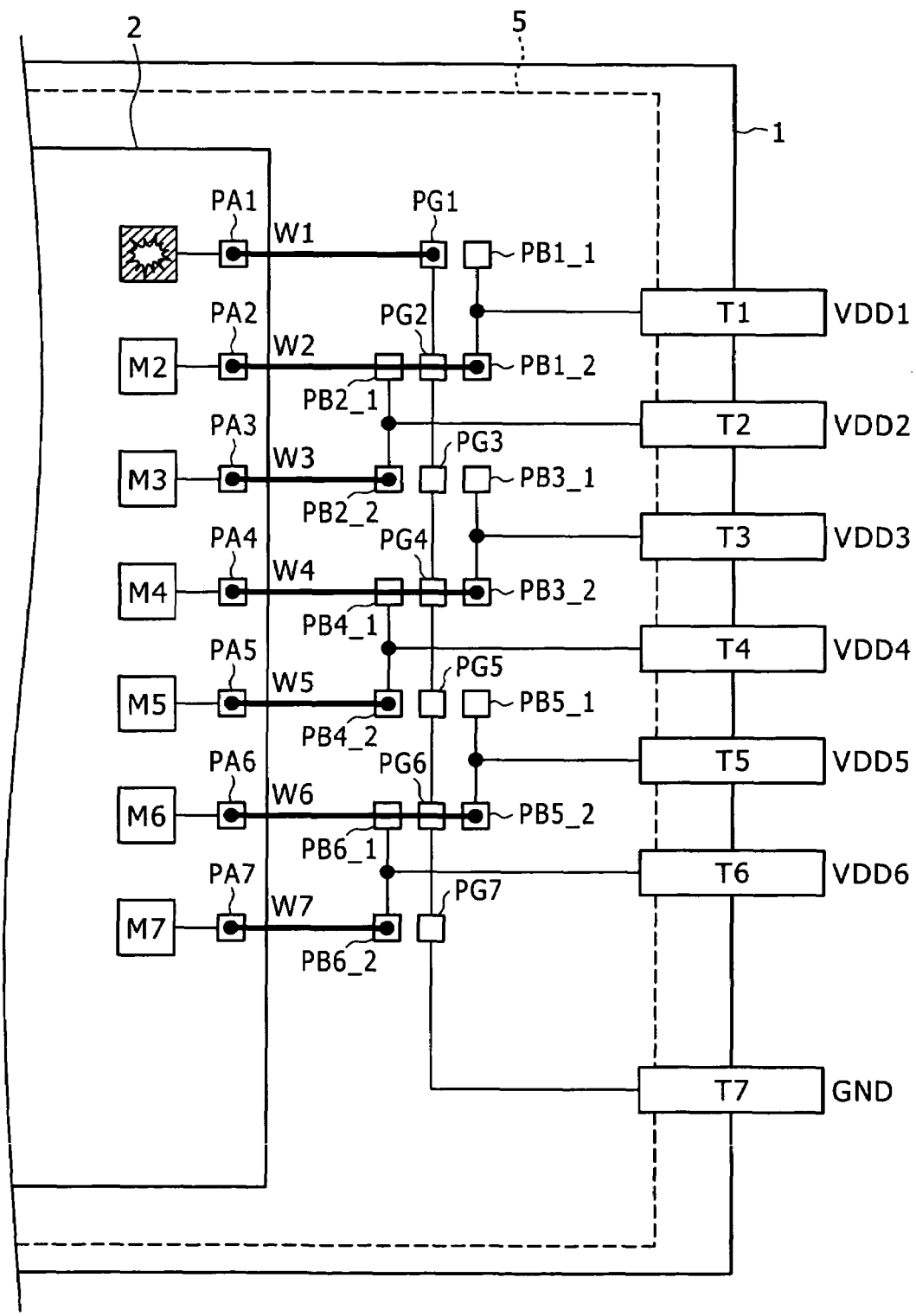
FIGS. 5 to 11 are schematic views showing different connection states of pads of the IC chip shown in FIG. 1 where a particular one of the modules is in a fault state.

For example, the pads PA2, PB1_2, PG2 and PB2_1 which compose the second partial set and the conductor line W2 which interconnects the pads are arranged in a juxtaposed relationship on a common straight line in FIG. 5. If a plane which includes the straight line and extends perpendicularly to the plane of FIG. 5 is assumed, then the pads PA2, PB1_2, PG2 and PB2_1 which compose the second partial set and the conductor line W2 which interconnects the pads are all arranged on the plane.

The plane described above differs among the different partial sets, and the planes on which the partial sets are arranged extend in parallel to each other. Therefore, the conductor lines arranged on the planes do not overlap nor intersect with the conductor lines disposed on the different planes in what manner the conductor lines are arranged on the planes.

For example, the plane on which the second partial set, that is, the pads PA2, PB2_1, PG2 and PB1_2, and the conductor line W2 are arranged and which is perpendicular to the plane of FIG. 5 and the plane on which the third partial set, that is, the pads PA3, PB3_1, PG3 and PB2_2, and the conductor line W3 are arranged and which is perpendicular to the plane of FIG. 5 have a parallel relationship to each other and have no intersecting portion therebetween. Accordingly, the conductor lines W2 and W3 which are included in the parallel planes never intersect with each other to whichever pads they are connected on the individual planes.

It is to be noted that the planes on which the partial sets are arranged need not necessarily be parallel to each other only if at least the condition that the planes do not have any intersecting portion on the conductor lines (W1 to W7) is satisfied.

In this manner, in the circuit apparatus shown in FIGS. 5 to 11, since the pads are arranged such that the conductor lines W1 to W7 do not intersect with each other, the conductor lines W1 to W7 can be formed readily by an ordinary wire bonding method.

Now, a relationship between the connection states of the modules, that is, allocation states of functions to the modules, and the connection states of the pads, is described in detail.

FIG. 5 shows a connection state of the pads where a fault occurs with the module M1.

In this instance, in the module selection section 50 described hereinabove of the IC chip 2, the module M1 is disconnected from all inputting and outputting portions, and the modules M2 to M7 and the inputting and outputting portions P1 to P6 are connected to each other, respectively. Consequently, the conductor lines W1 to W7 interconnect the pads so that the power supply voltages VDD1 to VDD6 are supplied to the modules M2 to M7, respectively, and 0 V (reference potential GND) is supplied as the power supply voltage to the module M1.

In particular, the conductor line W1 interconnects the pad PA1 for supplying power to the module M1 and the pad PG1 which has the reference potential.

The conductor line W2 interconnects the pad PA2 for supplying power to the module M2 and the pad PB1_2 which receives the power supply voltage VDD1 from the terminal T1.

The conductor line W3 interconnects the pad PA3 for supplying power to the module M3 and the pad PB2_2 which receives the power supply voltage VDD2 from the terminal T2.

The conductor line W4 interconnects the pad PA4 for supplying power to the module M4 and the pad PB3_2 which receives the power supply voltage VDD3 from the terminal T3.

The conductor line W5 interconnects the pad PA5 for supplying power to the module M5 and the pad PB4_2 which receives the power supply voltage VDD4 from the terminal T4.

The conductor line W6 interconnects the pad PA6 for supplying power to the module M6 and the pad PB5_2 which receives the power supply voltage VDD5 from the terminal T5.

The conductor line W7 interconnects the pad PA7 for supplying power to the module M7 and the pad PB6_2 which receives the power supply voltage VDD6 from the terminal T6.

Figure 6:
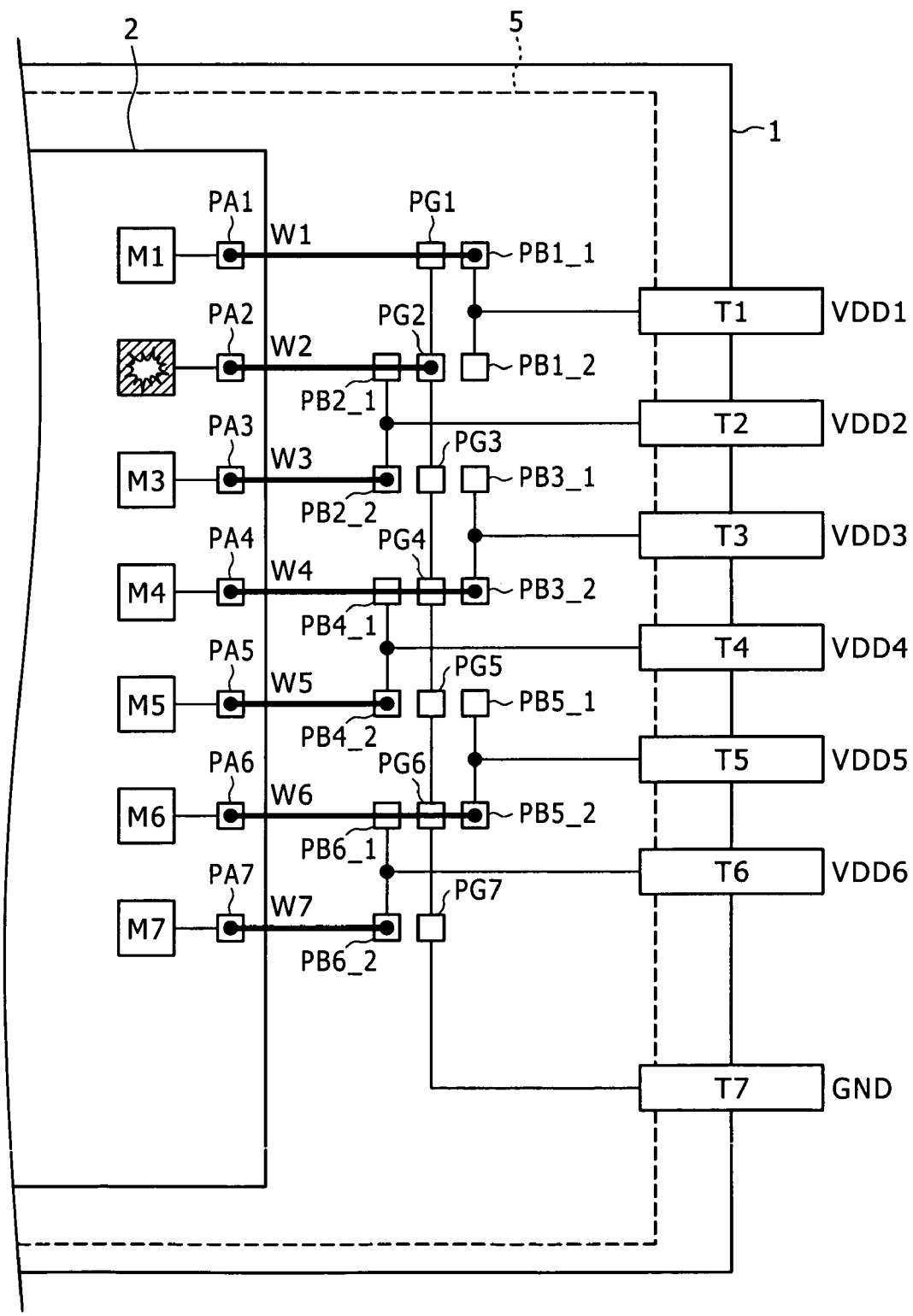

FIG. 6 shows a connection state of the pads where a fault occurs with the module M2.

In this instance, in the module selection section 50 of the IC chip 2, the module M2 is disconnected from all inputting and outputting portions, and the module M1 and the inputting and outputting portion P1 are connected to each other and the modules M3 to M7 and the inputting and outputting portions P2 to P6 are connected to each other, respectively. Consequently, the conductor lines W1 to W7 interconnect the pads so that the power supply voltage VDD1 is supplied to the module M1 and the power supply voltages VDD2 to VDD6 are supplied to the modules M3 to M7, respectively, and 0 V (reference potential GND) is supplied as the power supply voltage to the module M2.

In particular, the conductor line W1 interconnects the pad PA1 for supplying power to the module M1 and the pad PB1_1 which receives the power supply voltage VDD1 from the terminal T1.

The conductor line W2 interconnects the pad PA2 for supplying power to the module M2 and the pad PG2 which has the reference potential.

The conductor line W3 interconnects the pad PA3 for supplying power to the module M3 and the pad PB2_2 which receives the power supply voltage VDD2 from the terminal T2.

The conductor line W4 interconnects the pad PA4 for supplying power to the module M4 and the pad PB3_2 which receives the power supply voltage VDD3 from the terminal T3.

The conductor line W5 interconnects the pad PA5 for supplying power to the module M5 and the pad PB4_2 which receives the power supply voltage VDD4 from the terminal T4.

The conductor line W6 interconnects the pad PA6 for supplying power to the module M6 and the pad PB5_2 which receives the power supply voltage VDD5 from the terminal T5.

The conductor line W7 interconnects the pad PA7 for supplying power to the module M7 and the pad PB6_2 which receives the power supply voltage VDD6 from the terminal T6.

Figure 7:
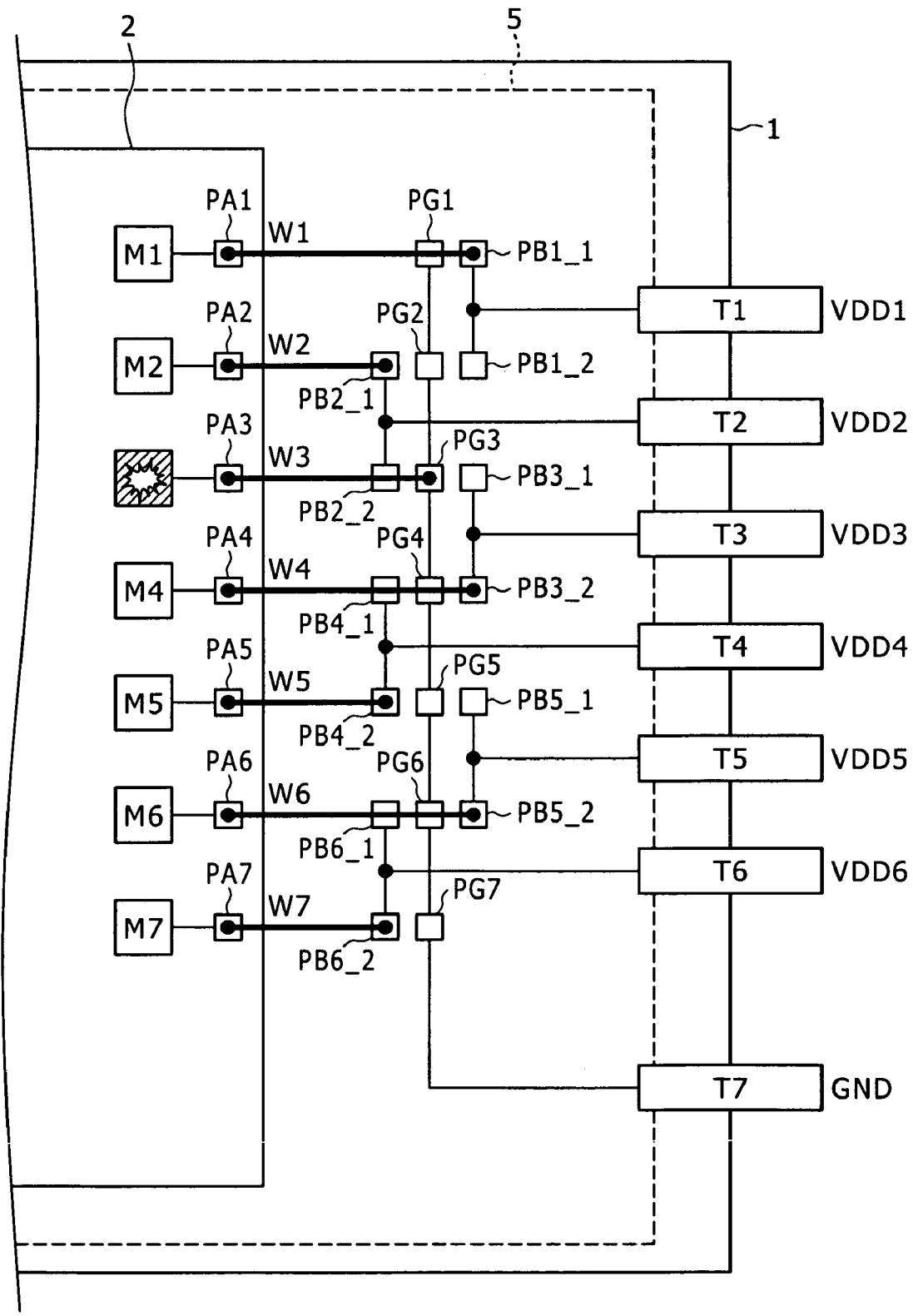

FIG. 7 shows a connection state of the pads where a fault occurs with the module M3.

In this instance, in the module selection section 50 of the IC chip 2, the module M3 is disconnected from all inputting and outputting portions, and the modules M1 and M2 and the inputting and outputting portions P1 and P2 are connected to each other, and the modules M4 to M7 and the inputting and outputting portions P3 to P6 are connected to each other, respectively. Consequently, the conductor lines W1 to W7 interconnect the pads so that the power supply voltages VDD1 and VDD2 are supplied to the modules M1 and M2 and the power supply voltages VDD3 to VDD6 are supplied to the modules M4 to M7, respectively, and 0 V (reference potential GND) is supplied as the power supply voltage to the module M3.

In particular, the conductor line W1 interconnects the pad PA1 for supplying power to the module M1 and the pad PB1_1 which receives the power supply voltage VDD1 from the terminal T1.

The conductor line W2 interconnects the pad PA2 for supplying power to the module M2 and the pad PB2_1 which receives the power supply voltage VDD2 from the terminal T2.

The conductor line W3 interconnects the pad PA3 for supplying power to the module M3 and the pad PG3 which has the reference potential.

The conductor line W4 interconnects the pad PA4 for supplying power to the module M4 and the pad PB3_2 which receives the power supply voltage VDD3 from the terminal T3.

The conductor line W5 interconnects the pad PA5 for supplying power to the module M5 and the pad PB4_2 which receives the power supply voltage VDD4 from the terminal T4.

The conductor line W6 interconnects the pad PA6 for supplying power to the module M6 and the pad PB5_2 which receives the power supply voltage VDD5 from the terminal T5.

The conductor line W7 interconnects the pad PA7 for supplying power to the module M7 and the pad PB6_2 which receives the power supply voltage VDD6 from the terminal T6.

Figure 8:
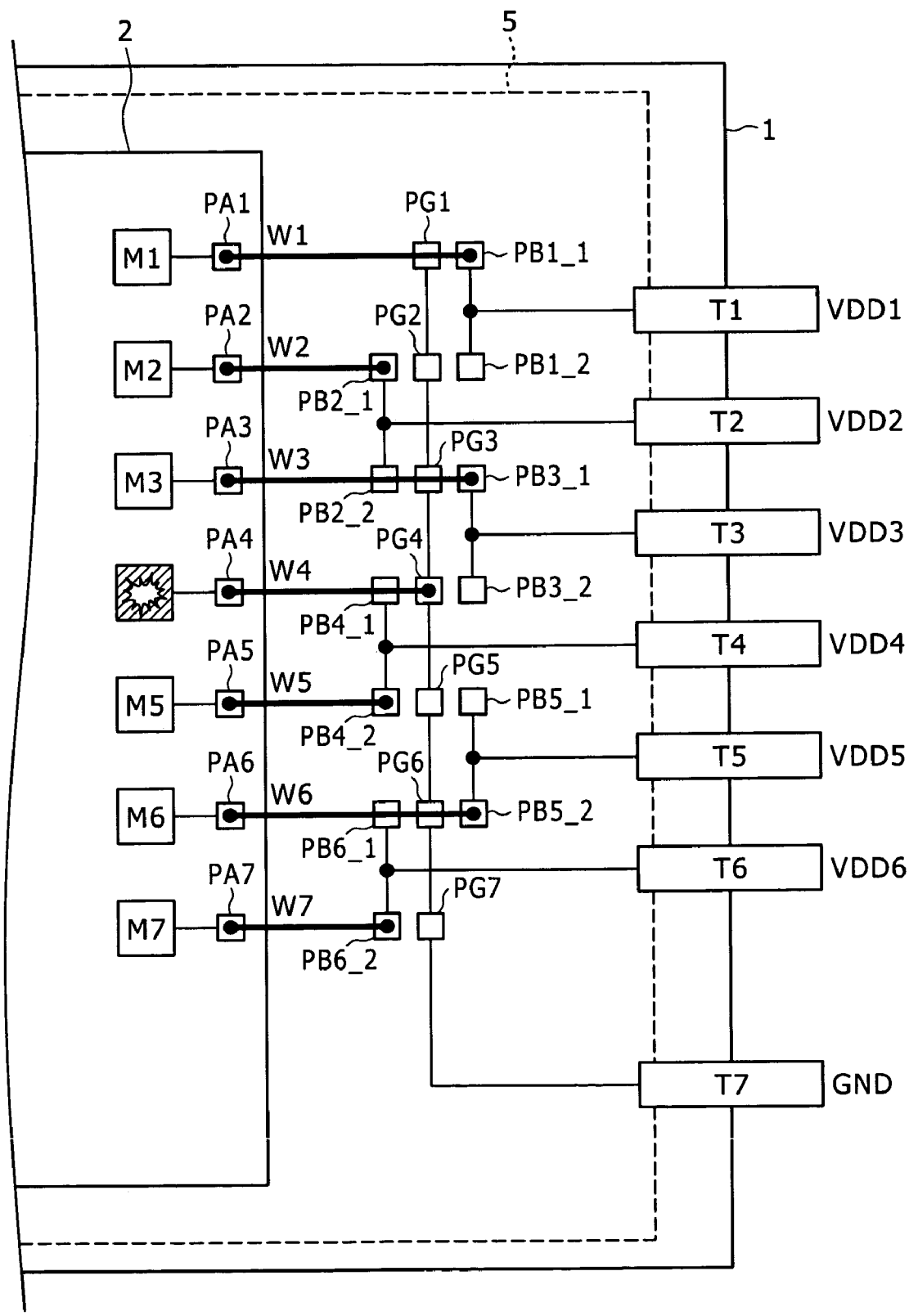

FIG. 8 shows a connection state of the pads where a fault occurs with the module M4.

In this instance, in the module selection section 50 of the IC chip 2, the module M4 is disconnected from all inputting and outputting portions, and the modules M1 to M3 and the inputting and outputting portions P1 to P3 are connected to each other, and the modules M5 to M7 and the inputting and outputting portions P4 to P6 are connected to each other, respectively. Consequently, the conductor lines W1 to W7 interconnect the pads so that the power supply voltages VDD1 to VDD3 are supplied to the modules M1 to M3 and the power supply voltages VDD4 to VDD6 are supplied to the modules M5 to M7, respectively, and 0 V (reference potential GND) is supplied as the power supply voltage to the module M4.

In particular, the conductor line W1 interconnects the pad PA1 for supplying power to the module M1 and the pad PB1_1 which receives the power supply voltage VDD1 from the terminal T1.

The conductor line W2 interconnects the pad PA2 for supplying power to the module M2 and the pad PB2_1 which receives the power supply voltage VDD2 from the terminal T2.

The conductor line W3 interconnects the pad PA3 for supplying power to the module M3 and the pad PB3_1 which receives the power supply voltage VDD3 from the terminal T3.

The conductor line W4 interconnects the pad PA4 for supplying power to the module M4 and the pad PG4 which has the reference potential.

The conductor line W5 interconnects the pad PA5 for supplying power to the module M5 and the pad PB4_2 which receives the power supply voltage VDD4 from the terminal T4.

The conductor line W6 interconnects the pad PA6 for supplying power to the module M6 and the pad PB5_2 which receives the power supply voltage VDD5 from the terminal T5.

The conductor line W7 interconnects the pad PA7 for supplying power to the module M7 and the pad PB6_2 which receives the power supply voltage VDD6 from the terminal T6.

Figure 9:
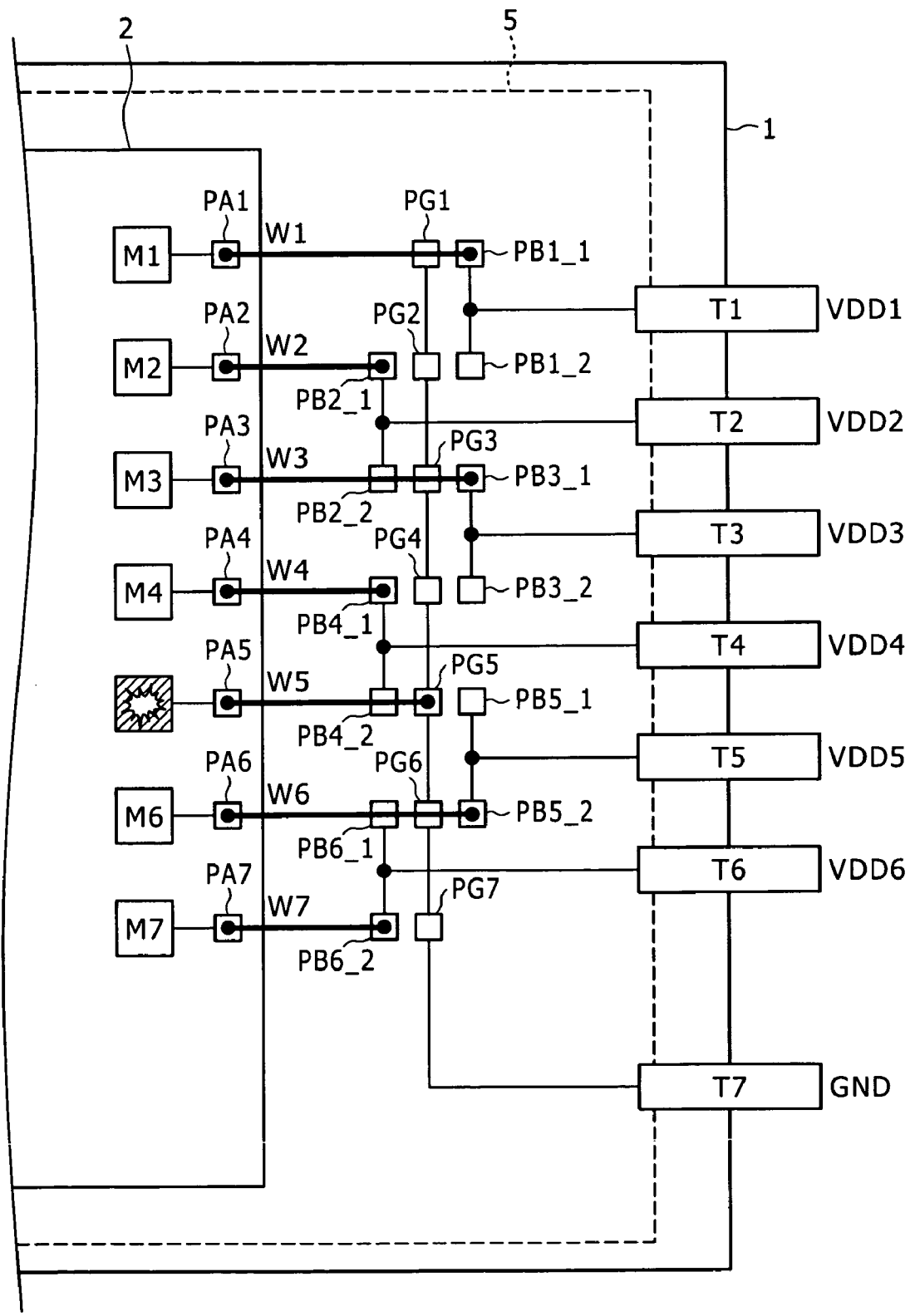

FIG. 9 shows a connection state of the pads where a fault occurs with the module M5.

In this instance, in the module selection section 50 of the IC chip 2, the module M5 is disconnected from all inputting and outputting portions, and the modules M1 to M4 and the inputting and outputting portions P1 to P4 are connected to each other, and the modules M6 and M7 and the inputting and outputting portions P5 and P6 are connected to each other, respectively. Consequently, the conductor lines W1 to W7 interconnect the pads so that the power supply voltages VDD1 to VDD4 are supplied to the modules M1 to M4 and the power supply voltages VDD5 and VDD6 are supplied to the modules M6 and M7, respectively, and 0 V (reference potential GND) is supplied as the power supply voltage to the module M5.

In particular, the conductor line W1 interconnects the pad PA1 for supplying power to the module M1 and the pad PB1_1 which receives the power supply voltage VDD1 from the terminal T1.

The conductor line W2 interconnects the pad PA2 for supplying power to the module M2 and the pad PB2_1 which receives the power supply voltage VDD2 from the terminal T2.

The conductor line W3 interconnects the pad PA3 for supplying power to the module M3 and the pad PB3_1 which receives the power supply voltage VDD3 from the terminal T3.

The conductor line W4 interconnects the pad PA4 for supplying power to the module M4 and the pad PB4_1 which receives the power supply voltage VDD4 from the terminal T4.

The conductor line W5 interconnects the pad PA5 for supplying power to the module M5 and the pad PG5 which has the reference potential.

The conductor line W6 interconnects the pad PA6 for supplying power to the module M6 and the pad PBS_2 which receives the power supply voltage VDD5 from the terminal T5.

The conductor line W7 interconnects the pad PA7 for supplying power to the module M7 and the pad PB6_2 which receives the power supply voltage VDD6 from the terminal T6.

Figure 10:
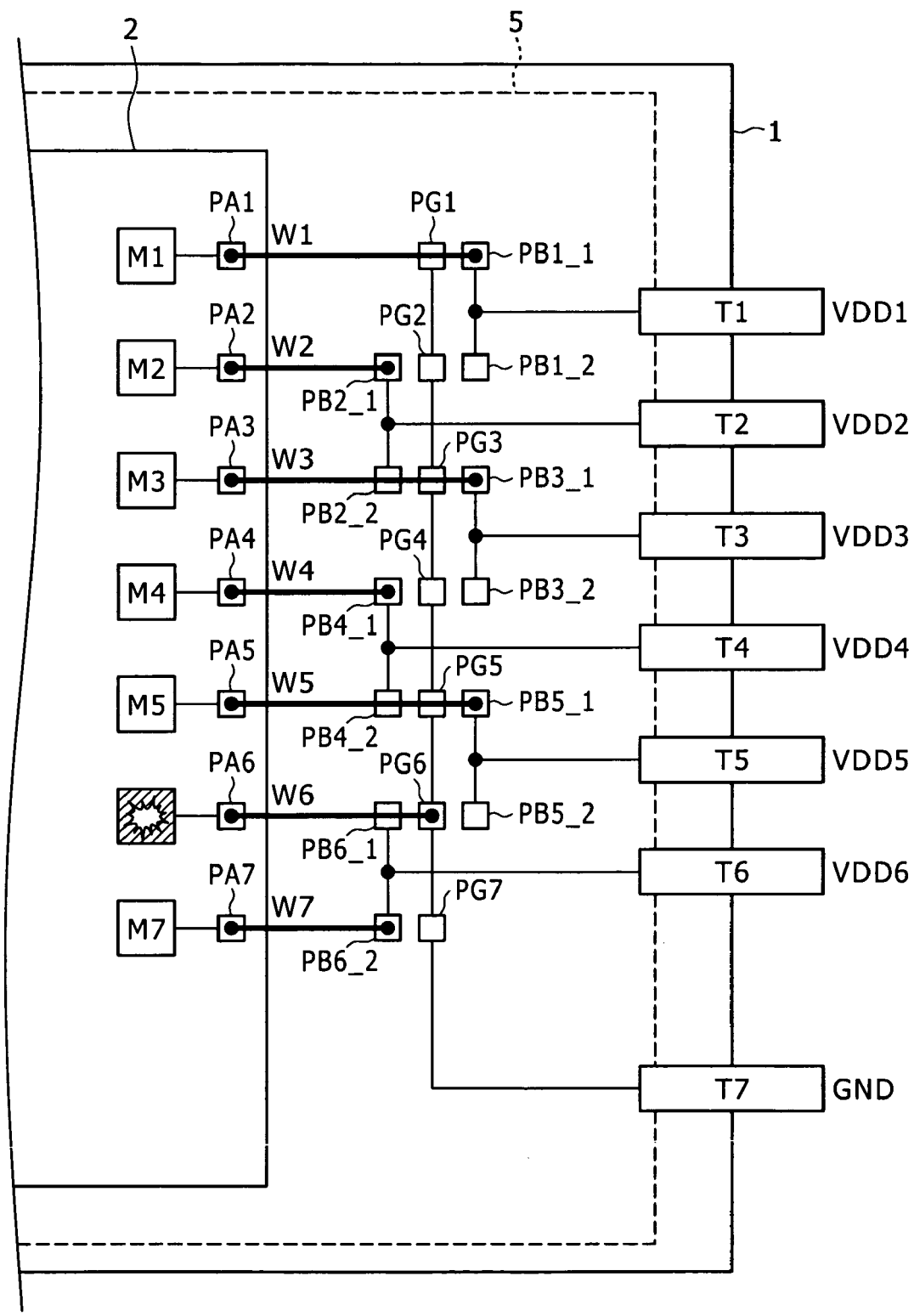

FIG. 10 shows a connection state of the pads where a fault occurs with the module M6.

In this instance, in the module selection section 50 of the IC chip 2, the module M6 is disconnected from all inputting and outputting portions, and the modules M1 to M5 and the inputting and outputting portions P1 to P5 are connected to each other, respectively, and the module M7 and the inputting and outputting portion P6 are connected to each other. Consequently, the conductor lines W1 to W7 interconnect the pads so that the power supply voltages VDD1 to VDD5 are supplied to the modules M1 to M5, respectively, and the power supply voltage VDD6 is supplied to the module M7, and 0 V (reference potential GND) is supplied as the power supply voltage to the module M6.

In particular, the conductor line W1 interconnects the pad PA1 for supplying power to the module M1 and the pad PB1_1 which receives the power supply voltage VDD1 from the terminal T1.

The conductor line W2 interconnects the pad PA2 for supplying power to the module M2 and the pad PB2_1 which receives the power supply voltage VDD2 from the terminal T2.

The conductor line W3 interconnects the pad PA3 for supplying power to the module M3 and the pad PB3_1 which receives the power supply voltage VDD3 from the terminal T3.

The conductor line W4 interconnects the pad PA4 for supplying power to the module M4 and the pad PB4_1 which receives the power supply voltage VDD4 from the terminal T4.

The conductor line W5 interconnects the pad PA5 for supplying power to the module M5 and the pad PB5_1 which receives the power supply voltage VDD5 from the terminal T5.

The conductor line W6 interconnects the pad PA6 for supplying power to the module M6 and the pad PG6 which has the reference potential.

The conductor line W7 interconnects the pad PA7 for supplying power to the module M7 and the pad PB6_2 which receives the power supply voltage VDD6 from the terminal T6.

Figure 11:
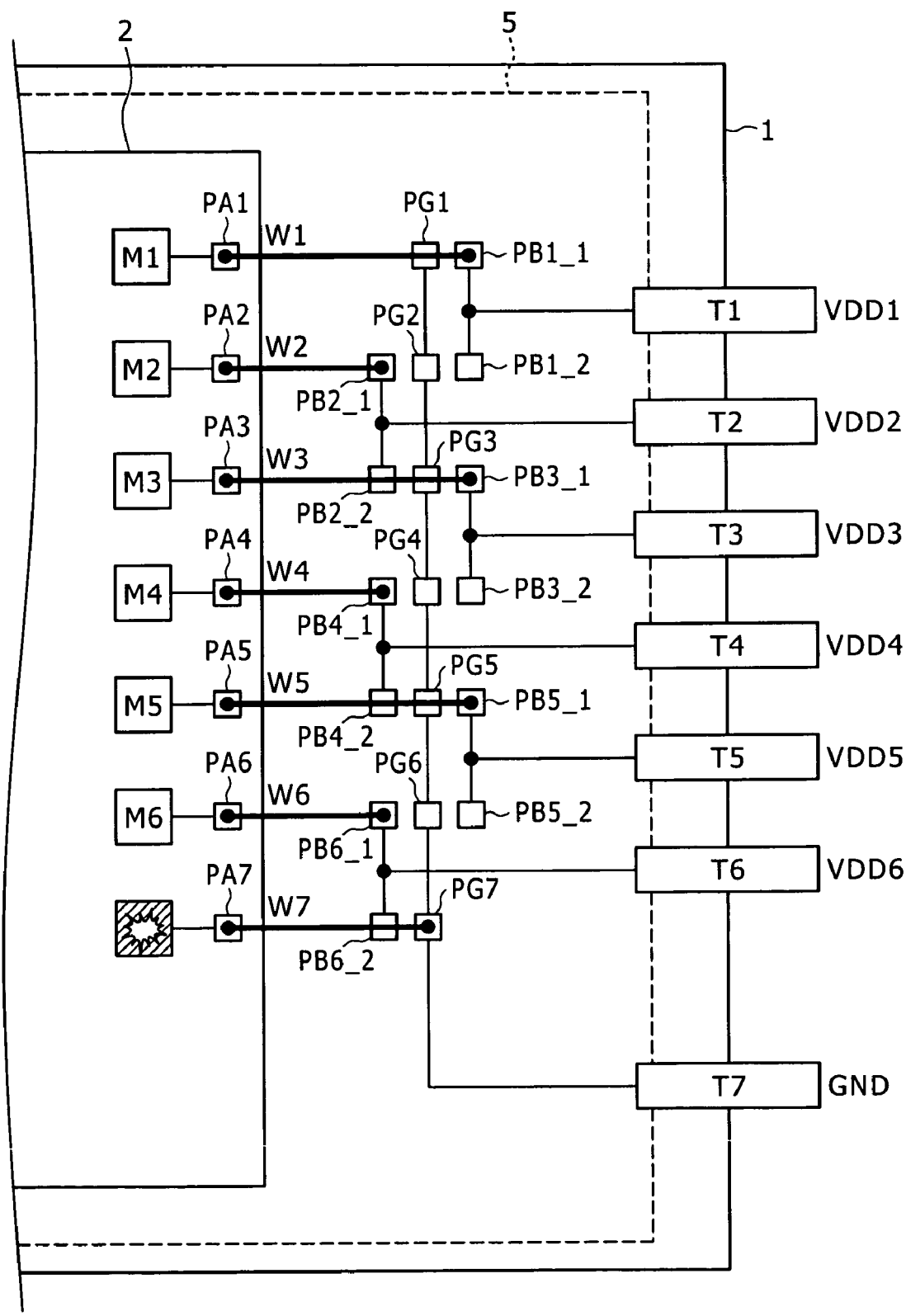

FIG. 11 shows a connection state of the pads where a fault occurs with the module M7.

In this instance, in the module selection section 50 of the IC chip 2, the module M7 is disconnected from all inputting and outputting portions, and the modules M1 to M6 and the inputting and outputting portions P1 to P6 are connected to each other, respectively. Consequently, the conductor lines W1 to W7 interconnect the pads so that the power supply voltages VDD1 to VDD6 are supplied to the modules M1 to M6, respectively, and 0 V (reference potential GND) is supplied as the power supply voltage to the module M7.

In particular, the conductor line W1 interconnects the pad PA1 for supplying power to the module M1 and the pad PB1_1 which receives the power supply voltage VDD1 from the terminal T1.

The conductor line W2 interconnects the pad PA2 for supplying power to the module M2 and the pad PB2_1 which receives the power supply voltage VDD2 from the terminal T2.

The conductor line W3 interconnects the pad PA3 for supplying power to the module M3 and the pad PB3_1 which receives the power supply voltage VDD3 from the terminal T3.

The conductor line W4 interconnects the pad PA4 for supplying power to the module M4 and the pad PB4_1 which receives the power supply voltage VDD4 from the terminal T4.

The conductor line W5 interconnects the pad PA5 for supplying power to the module M5 and the pad PB5_1 which receives the power supply voltage VDD5 from the terminal T5.

The conductor line W6 interconnects the pad PA6 for supplying power to the module M6 and the pad PB6_1 which receives the power supply voltage VDD6 from the terminal T6.

The conductor line W7 interconnects the pad PA7 for supplying power to the module M7 and the pad PG7 which has the reference potential.

Now, several modifications to the circuit apparatus according to the embodiment of present invention are described.

Figure 12:
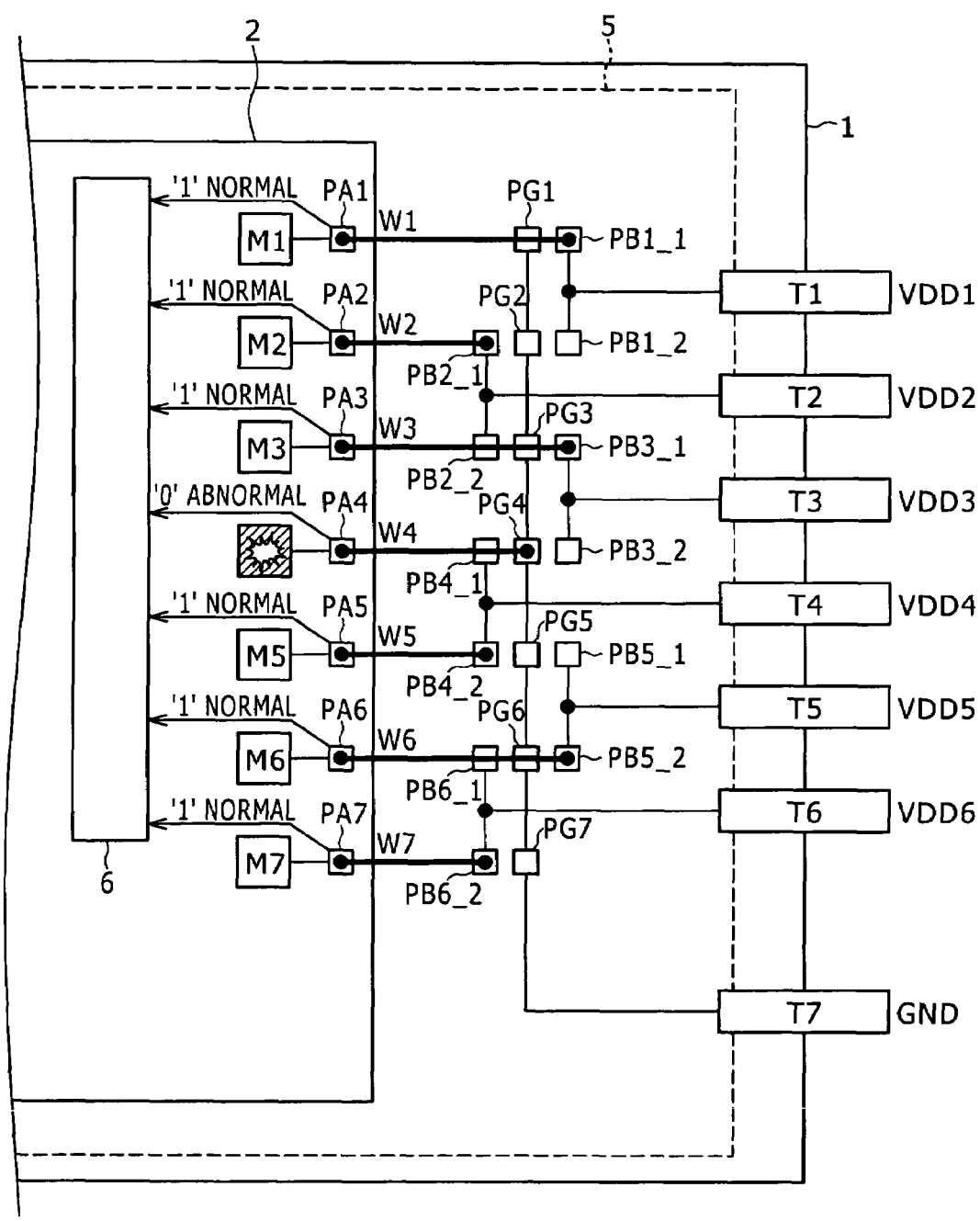

FIG. 12 shows a first modification to the circuit apparatus according to the embodiment of the present invention.

Referring to FIG. 12, the circuit apparatus according to the first modification is different from that of the embodiment described hereinabove in that the voltages inputted to the pads PA1 to PA7 of the first power inputting sections A1 to A7 are used as control signals for setting allocation by the function allocation section 3. In particular, the function allocation section 3 sets a one-on-one corresponding relationship between the modules M1 to M7 and the functions F1 to F7 in response to the voltages inputted to the pads PA1 to PA7 and allocates the functions coordinated in the one-on-one corresponding relationship to the modules M1 to M7, respectively.

In the first modification, a signal retaining section 6 for retaining a 7-bit signal corresponding to the voltages to be inputted to the first power inputting sections A1 to A7 is formed on the semiconductor substrate of the IC chip 2.

The signal retaining section 6 retains the voltages of the pads PA1 to PA7 as logic signals of '1' or '0' in an initial state such as, for example, a state immediately after the power supply to the circuit apparatus 1 is made available. For example, if the voltage inputted to any of the pads PA1 to PA7 is higher than a predetermined threshold level, then a signal of '1' is retained, but if it is a voltage lower than the threshold value, then a signal of '0' is retained. Consequently, the reference potential GND is inputted to any pad for which a signal of '0' is retained, and it can be recognized that the redundant function F7 should be allocated to the module corresponding to the pad, that is, the module should be disconnected from all inputting and outputting portions. Accordingly, the signal retained in the signal retaining section 6 can be utilized as control signals for the function allocation section 3. For example, the storage section 70 shown in FIG. 4 may be used in replace of the signal retaining section 6.

FIG. 13 shows a second modification to the circuit apparatus according to the embodiment of the present invention.

Referring to FIG. 13, the circuit apparatus of the second modification is different from that of the embodiment in that a plurality of pads are provided for inputting of power to each module. For example, where the power consumption of the modules is high, the current capacity of one power supply pad may be insufficient, and in this instance, a plurality of power supply pads are required. In this instance, each of the pads formed on the IC chip 2 and the pads formed on the interposer substrate 5 is increased to a plurality of pads, and required ones of the pads are interconnected using bonded wires. By the countermeasure just described, the current capacity of the feed paths to the modules can be increased while keeping a relationship in electric connection same as that of the circuit apparatus described hereinabove.

Two pads PAna and PAnb ($1 \leq n \leq 7$) shown in FIG. 13 have an electric connection relationship same as the pad PAn in the circuit apparatus shown in FIGS. 5 to 11.

Two pads PBi_1a and PBi_1b ($1 \leq i \leq 7$) shown in FIG. 13 have an electric connection relationship same as the pad PBi_1 in the circuit apparatus shown in FIGS. 5 to 11.

Two pads PBi_2a and PBi_2b shown in FIG. 13 have an electric connection relationship same as the pad PBi_2 in the circuit apparatus shown in FIGS. 5 to 11.

Two pads PGna and PGnb shown in FIG. 13 have an electric connection relationship same as the pads PGn in the circuit apparatus shown in FIGS. 5 to 11.

Pads PA1a, PB1_1a and PG1a form a partial set corresponding to the module M1. A conductor line W1a interconnects the pads PA1a and PB1_1a or the pads PA1a and PG1a both belonging to the partial set.

Pads PA1b, PB1_1b and PG1b form another partial set corresponding to the module M1. A conductor line W1b interconnects the pads PA1b and PB1_1b or the pads PA1b and PG1b both belonging to the partial set.

Pads PAja, PB(j−1)_2a, PBj_1a and PGja form a partial set corresponding to the module Mj ($2 \leq j \leq 6$). A conductor line Wja interconnects the pads PAja and PB(j−1)_2a, the pads PAja and PBj_1a or the pads PAja and PGja.

Pads PAjb, PB(j−1)_2b, PBj_1b and PGjb form another partial set corresponding to the module Mj. A conductor line Wjb interconnects the pads PAjb and PB(j−1)_2b, the pads PAjb and PBj_1b or the pads PAjb and PGjb.

Pads PA7a, PB6_2a and PG7a form a partial set corresponding to the module M7. A conductor line W7a interconnects the pads PA7a and PB6_2a or the pads PA7a and PG7a both belonging to the partial set.

Pads PA7b, PB6_2b and PG7b form another partial set corresponding to the module M7. A conductor line W7b interconnects the pads PA7b and PB6_2b or the pads PA7b and PG7b both belonging to the partial set.

Similarly as in the circuit apparatus of FIGS. 5 to 11 described hereinabove, pads which belong to the same partial set and a conductor line interconnecting the pads are arranged on the same plane. Further, the plane described differs among different partial sets, and the planes on which the partial sets are arranged have a parallel relationship to each other or have no intersecting portion between the conductor lines.

Therefore, the conductor lines W1a to W7a and W1b to W7b can interconnect the pads without intersecting with each other as seen in FIG. 13.

Figure 14:
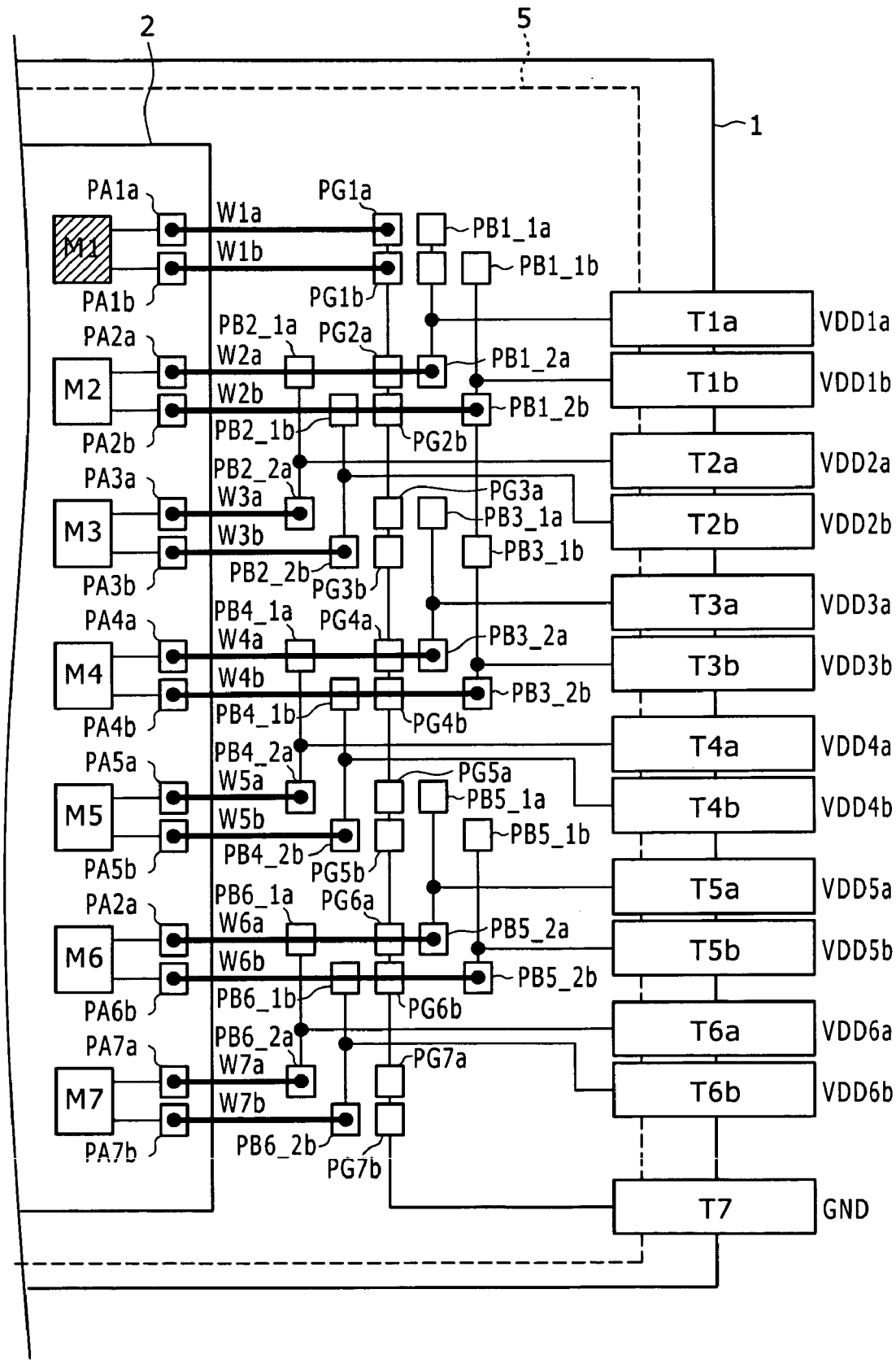

FIG. 14 shows a third modification to the circuit apparatus according to the embodiment of the present invention.

Referring to FIG. 14, the circuit apparatus of the third modification is different from that of the embodiment in that a plurality of pads are provided for inputting of power to each module and besides different power supplies are supplied from the plural pads to one module. Therefore, the circuit apparatus of the present modification is a modification also to that of the second modification.

Referring to FIG. 14, in the circuit apparatus shown, wiring lines of the interposer substrate 5 are formed such that, of the four pads (PBi_1a, PBi_2a, PBi_1b and PBi_2b) connected commonly to the terminal Ti in the circuit apparatus shown in FIG. 13, the two pads PBi_1a and PBi_2a are connected to a terminal Tia while the other two pads PBi_1b and PBi_2b are connected to another terminal Tib and besides the pads PBi_1a and PBi_2a and the pads PBi_1b and PBi_2b are electrically isolated from each other.

It is to be noted that partial sets of the pads formed in the circuit apparatus shown in FIG. 14 are same as the partial sets described hereinabove in connection with the circuit apparatus shown in FIG. 13. Therefore, the conductor lines W1a to W7a and W1b to W7b do not intersect with each other similarly as in the circuit apparatus shown in FIG. 13.

In the circuit apparatus shown in FIG. 14, when the modules are to operate, power supply voltages VDD(j−1)a and VDD(j−1)b or VDDja and VDDjb are supplied to the module Mj ($2 \leq j \leq 6$) while power supply voltages VDD1a and VDD1b are supplied to the module M1 and power supply voltages VDD6a and VDD6b are supplied to the module M7.

Figure 15:
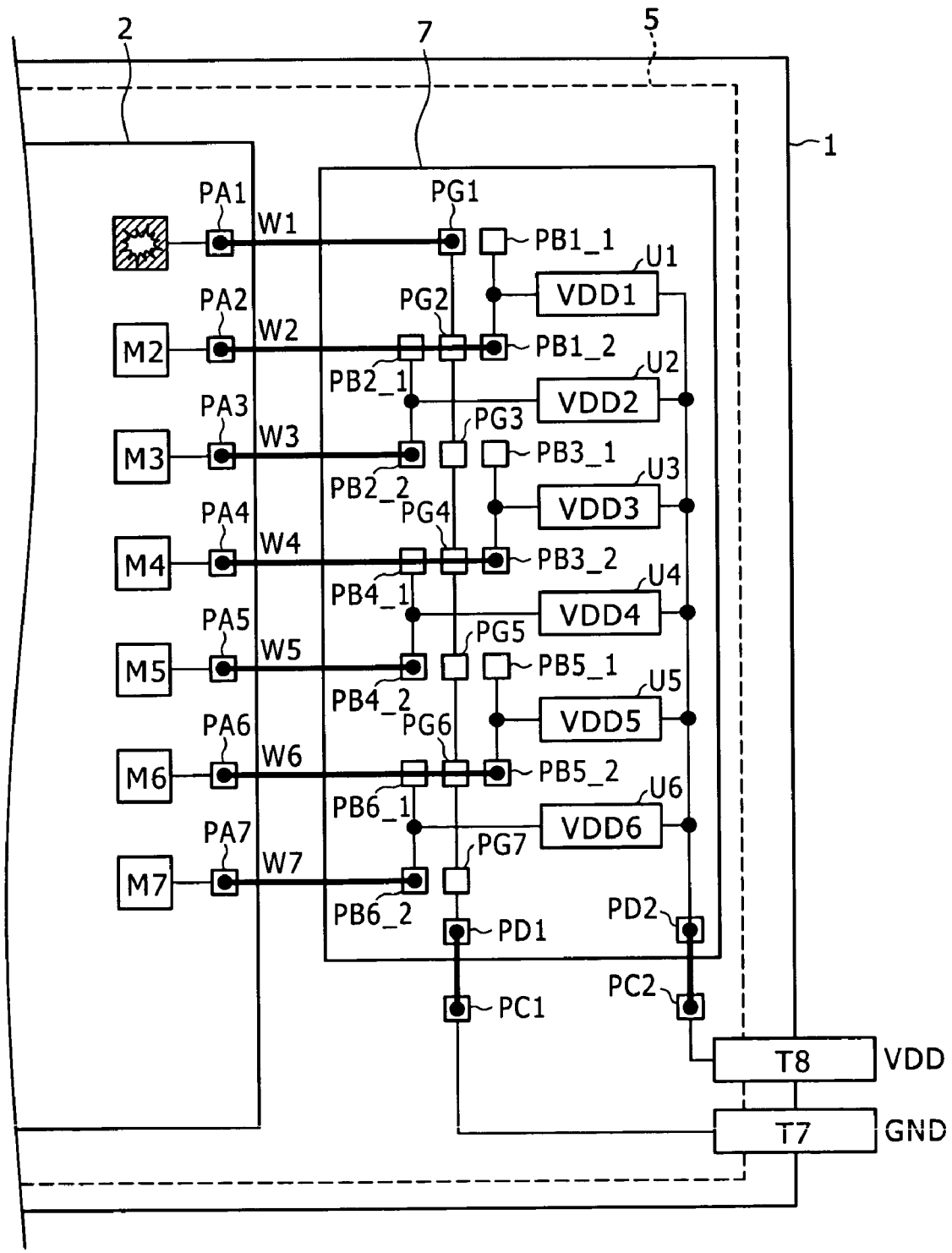

FIG. 15 shows a fourth modification to the circuit apparatus according to the embodiment of the present invention.

Referring to FIG. 15, the circuit apparatus of the fourth modification is different from those of the embodiment and the modifications described hereinabove in that an IC chip 7 separate from the IC chip 2 is provided on the circuit apparatus 1 such that the power supply voltages VDD1 to VDD6 are supplied from the IC chip 7 to IC chip 2.

In particular, the circuit apparatus of the fourth modification corresponds to a circuit apparatus of the type called SIF (system in package) or MCM (multi chip module) wherein a plurality of IC chips are integrated in one package.

On the interposer substrate 5, a pad PC2 connected to a terminal T8 to which a power supply voltage VDD is inputted and a pad PC1 connected to a terminal T7 to which the reference potential GND is inputted are formed.

Meanwhile, on the IC chip 7, pads PB1_1 to PB6_1, PB1_2 to PB6_2 and PG1 to PG7 which are similar to those formed on the interposer substrate 5 in the circuit apparatus shown in FIGS. 5 to 11, pads PD1 and PD2 connected to the pads PC1 and PC2 of the interposer substrate 5 by bonding wires, respectively, and voltage regulator circuits U1 to U6 are formed.

The voltage regulator circuits U1 to U6 convert the power supply voltage VDD inputted from the pad PD2 into power supply voltages VDD1 to VDD6, respectively.

The pad PDI which receives the reference potential GND is connected to the pads PG1 to PG7 through the wiring lines on the IC chip 7.

The pads PB1_1 to PB6_1, PB1_2 to PB6_2 and PG1 to PG7 formed on the IC chip 7, the pads PA1 to PA7 formed on the IC chip 2 and the conductor lines W1 to W7 which interconnect the pads mentioned have a connection relationship similar to that in the circuit apparatus shown in FIGS. 5 to 11. Also the arrangement of the pads and the conductor lines is similar to that of the circuit apparatus shown in FIGS. 5 to 11. In particular, the pads (PA1 to PA7) formed on the IC chip 2 and the pads (PB1_1 to PB6_1, PB1_2 to PB6 2 and PG1 to PG7) formed on the IC chip 7 are connected to each other by the conductor lines W1 to W7 formed by wire boding.

Accordingly, also in the circuit apparatus which includes a plurality of IC chips as seen in FIG. 15, the connection scheme for power supplies can be changed in accordance with allocation of functions to the individual modules similarly as in the circuit apparatus shown in FIGS. 5 to 11.

Figure 16:
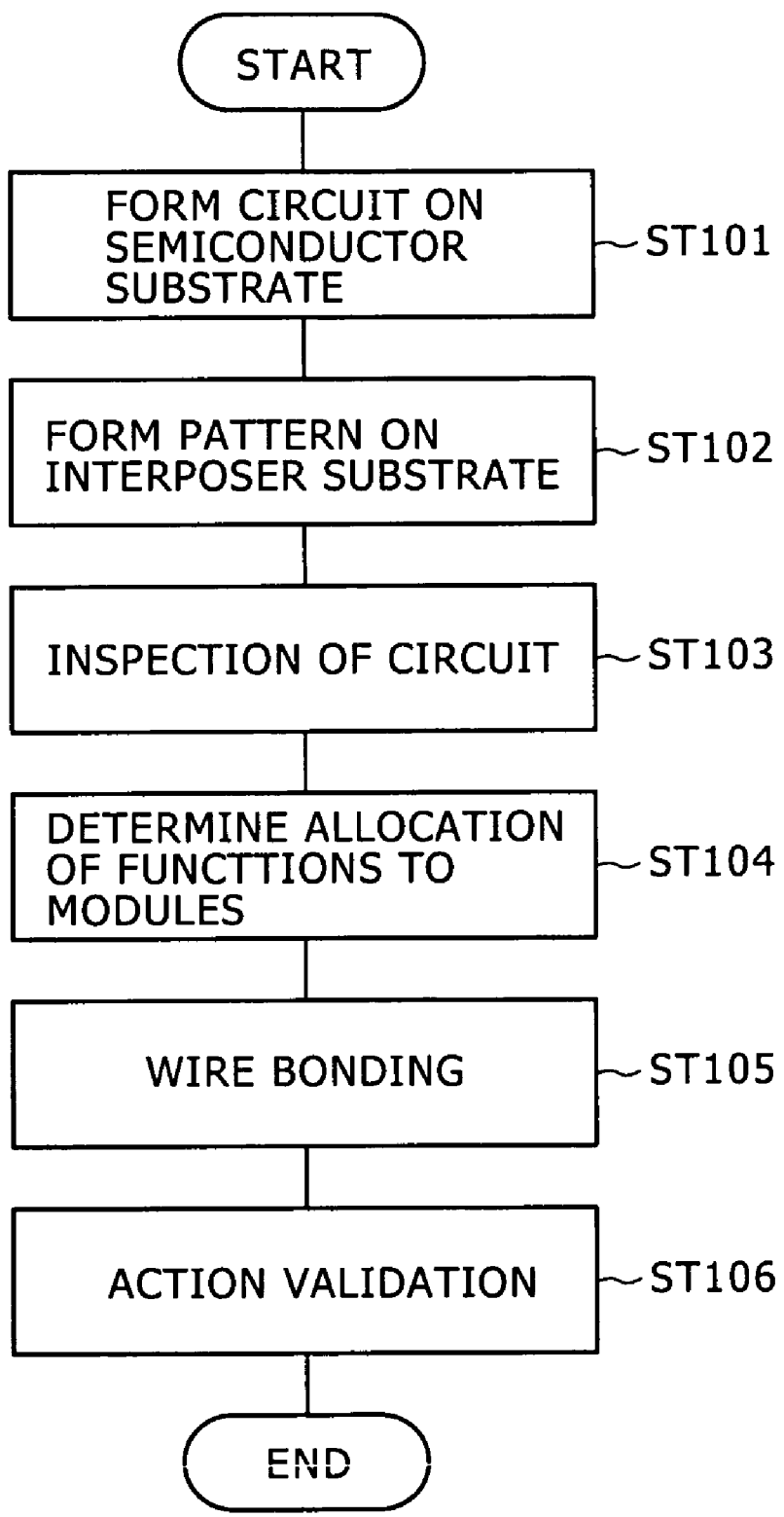
FIG. 16 is a flow chart illustrating a fabrication method of the circuit apparatus shown in FIG. 1.

Now, a fabrication method of the circuit apparatus according to the present embodiment described above is described with reference to a flow chart of FIG. 16

Step ST101:

A circuit of the IC chip 2 described hereinabove is formed on a semiconductor wafer. In the fabrication of the circuit apparatus shown in FIG. 15, a circuit of the IC chip 7 is formed on another semiconductor wafer.

Step ST102:

Parts of the interposer substrate 5 and so forth to be incorporated in the circuit apparatus are produced. Power supply pads to be connected to the IC chip 2 by wire bonding and so forth are formed on the interposer substrate 5.

Step ST103:

A test of ICs formed on the semiconductor wafer is performed. As regards the IC chip 2, it is decided whether or not each of the modules M1 to M7 has some fault.

Step ST104:

Allocation of functions to the modules of the IC chip 2 is determined such that, if the test at step ST103 proves that all of the modules are free from any fault, then a predetermined one of the modules is placed into a non-used state, but if a fault is found out, then the faulty module is placed into a non-used state.

Step ST105:

A connection relationship between the power inputting sections of the modules M1 to M7 formed on the IC chip 2 and the power inputting sections of the power supply voltages VDD1 to VDD6 formed on the interposer substrate 5 (in the case of the circuit apparatus shown in FIG. 15, the power inputting sections of the power supply voltages VDD1 to VDD6 formed on the IC chip 7) is determined based on the allocation of the functions to the modules determined at step ST104. In particular, the connection relationship is determined such that the power supply voltage VDDi is inputted to the module to which the function Fi ($1 \leq i \leq 6$) is allocated whereas the power supply of 0 volt is inputted to the module to which the redundant function F7 is allocated. The determined connection relationship is passed as bonding information to a bonding apparatus.

The parts after the inspection such as the IC chip 2 and the interposer substrate 5 are assembled and mounted on the bonding apparatus. The bonding apparatus performs wire bonding of the IC chip 2 and the interposer substrate 5 (in the case of the circuit apparatus shown in FIG. 15, the IC chip 2 and the IC chip 7) based on the bonding apparatus passed thereto for each IC chip 2.

Step ST106:

Another test is performed for a package after the wire bonding to validate whether or not the result of the wire bonding is acceptable and whether or not redundancy relief by each module is acceptable. It is finally validated that, for example, no power is supplied to the module to which the redundant function is allocated while power is supplied to the other modules or the entire system operates normally.

Figure 17:
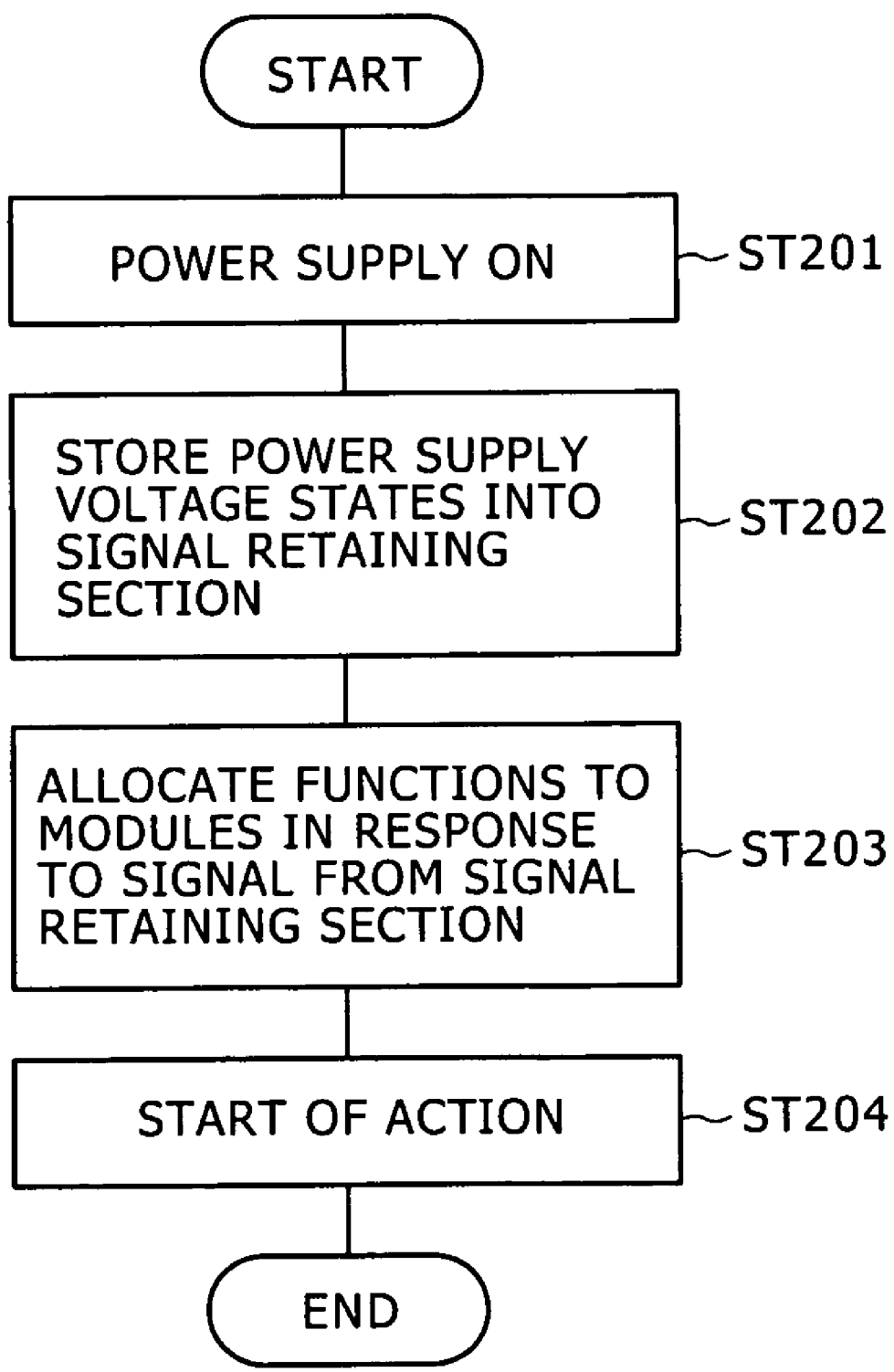
FIG. 17 is a flow chart illustrating an example of operation of the modified circuit apparatus shown in FIG. 12 when the power supply is made available.

Now, operation of the circuit apparatus of the first modification shown in FIG. 12 after the power supply is made available is described with reference to a flow chart of FIG. 17.

Step ST201:

Power is supplied to all power supply pins of the circuit apparatus. Consequently, the power inputting pad for a fault module to which the redundant function F7 is allocated exhibits the low level (logic value '0') while the power inputting pads for the other normal modules exhibit the high level (logic value '1').

Step ST202:

The logic values corresponding to the power supply voltages to all modules are retained into the signal retaining section 6.

Where the fixed power supply voltages VDD1 to VDD6 continue to be always supplied to those modules which are operative, since signals of the same logic value are always regained in the signal retaining section 6, the signal retaining section 6 is not required. However, if such a power consumption reduction countermeasure that power supply to a module which is placed into an inoperative state during operation of the system is stopped or the power supply voltages VDD1 to VDD6 are dynamically adjusted in response to the operation speed of the modules is taken, then the power supply voltage supplied to each module may differ from its initial state. In this instance, if information of the power supply voltage supplied to the module in an initial state is not stored, then the allocation of functions in the function allocation section 3 is placed out of an appropriate state midway of the operation. Accordingly, where the power supply voltage of any module varies, it is necessary to retain information of the module power supply voltages in an initial state by means of the signal retaining section 6.

Step ST203:

The signals corresponding to the power supply voltages to the modules retained in the signal retaining section 6 are inputted as control signals to the function allocation section 3. Consequently, the function allocation section 3 performs allocation of functions to the modules so that the fault module may be placed into a non-used state.

After the allocation of functions by the function allocation section 3 is completed, that is, for example, after changeover between the modules and the inputting and outputting portions in the module selection section 50 is completed, operation of the system is started.

During the operation of the system since the power supply to the fault module is normally kept off, useless leak power consumption by the fault module is suppressed.

Further, during operation of the system, such control as to turn off power supply to any module which is in an inoperative state or to adjust the power supply voltage to any module upwardly or downwardly in response to an operation speed required for the module is performed.

Since a corresponding relationship between the six modules which are in an operative state and the six power supply voltages (VDD1 to VDD6) can be recognized through reference to the signal retaining section 6, if any of the modules is placed into an inoperative state, then the power to be supplied to the module can be turned off to reduce the leak power. Further, if the operation speed of any module drops, then the power supply voltage to be supplied to the module can be lowered thereby to reduce the operation power.

As described above, with the circuit apparatus according to the present embodiment, in the first power inputting section An ($1 \leq n \leq 7$), power to be supplied to the module Mn is inputted, and in the second power inputting section Bi ($1 \leq i \leq 6$), a power supply voltage VDDi to be supplied to a module having the function Fi is inputted. In the function allocation section 3, a one-on-one corresponding relationship between the functions F1 to F7 and the modules M1 to M7 is set in response to control signals inputted thereto, and functions coordinated in a one-on-one corresponding relationship to the modules M1 to M7 are allocated to the modules M1 to M7. In the connection section 4, some of the first power inputting sections A1 to A7 and the second power inputting sections B1 to B6 are connected to each other by wire bonding so that the power supply voltage VDDi is supplied to the module to which the function Fi is allocated.

Consequently, the power supply voltages to be supplied to the modules M1 to M7 can be controlled appropriately in response to the functions to be allocated to the modules without additionally providing a specific fabrication step or without providing a complicated circuit.

In particular, to the module to which the function Fi is allocated, power can always be supplied through the second power inputting section Bi without depending upon the function allocation state by the function allocation section 3. Therefore, even if allocation of a function to a module becomes different, for example, as a result of carrying out of a relief against a fault, there is no necessity to change the power supply to be inputted to the second power supply inputting section from the outside of the circuit apparatus. Consequently, there is no necessity to provide hardware for exclusive use for changing the power supply to be inputted to the second power supply inputting section outside the circuit apparatus or to provide a surplus fabrication step for changing the inputting destination of power supply for each circuit apparatus.

For example, if the power supply to a module which is placed into an inoperative state during operation is controlled between on and off by a circuit provided outside the circuit apparatus, then leak power consumption by the module in the inoperative state can be suppressed. Further, where the leak power disperses among different modules as a result of dispersion of the fabrication process or the like, if the power supply voltages to the modules are adjusted individually, then static leak power of the circuit apparatus can be suppressed. Further, in a case wherein the operation speed required for a module varies momentarily in response the operation condition, if the power supply voltage to each module is adjusted in response to the operation condition, then dynamic power consumption of the circuit apparatus can be reduced. Where such control of the power supply is to be performed, it is necessary to supply predetermined power to a module to which a predetermined function is allocated. However, if a power inputting terminal provided outside a package of a circuit apparatus and the function of a module to which power is to be supplied through the terminal differ amount different fabricated circuit apparatus, then predetermined power cannot be supplied to a predetermined module. Therefore, such power supply control as described above cannot be performed. In order to perform the power supply control, surplus hardware or a surplus fabrication step is required.

With the circuit apparatus according to the present embodiment, the power supply voltage VDDI can always be supplied to a module of the function Fi through the second power inputting section Bi without depending upon the allocation of functions to the modules. Therefore, such power supply control of the individual modules as described above can be performed without additional provision of surplus hardware or a surplus fabrication step.

Further, with the circuit apparatus according to the present embodiment, since the allocation of functions by the function allocation section 3 can be changed by changing the connection between the first power supply inputting sections and the second power supply inputting sections, there is no necessity to provide such a circuit as a power gate in order to switch off the power supply to a non-used module. Consequently, increase of the area of an IC chip can be prevented.

In addition, since the necessity for a fuse which is necessitated where a power gate is used to switch off the power supply to a non-used module is eliminated, increase of the area when compared with an alternative case wherein a fuse is formed on a chip can be suppressed effectively. Further, since the necessity for a fuse is eliminated, also the necessity for a process for exclusive use for cutting a fuse is eliminated.

Further, with the circuit apparatus according to the present embodiment, a process for switching off the power supply to a redundant module is completed within a package of the circuit apparatus, and the power inputting terminals T1 to T6 provided outside the package all serve as terminals for inputting power supply to normal modules. Therefore, when compared with an alternative case wherein the package of the circuit apparatus includes a surplus terminal connecting to a power supply line to the redundant module, the number of terminals of the package decreases and the fabrication cost of the circuit apparatus can be suppressed.

Further, since there is no necessity to provide a surplus wiring line pattern for a redundant module on a set substrate on which the circuit apparatus is to be mounted, design of the set substrate is facilitated and the fabrication cost can be suppressed.

Besides, where a circuit for switching the power to be supplied to each module on and off is provided outside the package or where a circuit for dynamically controlling the power supply voltage to each module is provided outside the package, there is no necessity to provide a surplus circuit for a redundant module. Therefore, the fabrication cost can be reduced as much.

Further, with the circuit apparatus according to the present embodiment, since the allocation of functions by the function allocation section 3 is set in response to the power supply voltages for the modules inputted to the first power inputting sections A1 to A7, information relating to the allocation of the functions to the modules need not be stored in the IC chip 2. Consequently, since the necessity for a fuse, a nonvolatile memory or the like for retaining information in the IC chip 2 such as, for example, the storage section 70 shown in FIG. 4 is eliminated, reduction of the chip size and simplification of a fabrication process can be anticipated.

While an embodiment of the present invention is described above, the present invention is not limited to the embodiment described above but includes further various variations.

For example, while, in the embodiment described above, a circuit apparatus which uses a redundant module to achieve relief against a fault is taken as an example, the present invention is not limited to this. In particular, the present invention can be applied also to a circuit apparatus which does not include a redundant module but replaces functions of modules. For example, the present invention can be applied to a circuit apparatus wherein the allocation of functions to circuits is changed in response to a dispersion in operation performance of individual chips.

A circuit apparatus in accordance with the present invention is not limited to a semiconductor integrated circuit or an SIP, but the present invention can be applied also to an apparatus of a greater unit.

The numerical values specifically given in the description of the embodiment such as, for example, the number of modules, the number of power inputting and outputting portions, the number of inputting and outputting portions and the number of module blocks, are mere examples and can be suitably changed to arbitrary values.

What is claimed is:

1. A circuit apparatus, comprising:
   a plurality of modules having functions which can be substituted for each other;
   a function allocation section configured to set a one-on-one corresponding relationship between a plurality of predetermined functions and said plural modules in response to a control signal inputted thereto and allocate the functions coordinated in accordance with the one-on-one relationship individually to said modules;
   a plurality of first power inputting sections configured to input power supplies to be supplied to said modules;
   a plurality of second power inputting sections configured to input power supplies each corresponding to at least one of the functions; and
   a connection section configured to connect at least some of said first power inputting sections and said second power inputting sections so that each of the power supplies inputted by said second power inputting sections is supplied to that one of said modules to which a function corresponding to the power supply is allocated.

2. The circuit apparatus according to claim 1 wherein:
   said function allocation section allocates a redundant function to at least one of said modules; and
   said connection section connects that one of said first power inputting sections which is used to input a power supply to the module to which the redundant function is allocated to a reference potential line.

3. The circuit apparatus according to claim 1, wherein:
   said first power inputting sections and said second power inputting sections are formed on substrates different from each other; and
   said connection section includes conductors for electrically connecting circuits individually formed on the substrates different from each other.

4. The circuit apparatus according to claim 3, wherein each of said first power inputting sections and said second power inputting sections includes at least one pad capable of connecting to one of the conductors;
   an entire set of the pads being classified into a plurality of partial sets in each of which one pad pair in the maximum is connected by one of the conductors;
   the pads which belong to the same partial set and a conductor for connecting the pads being arranged on the same plane;
   the plane being different among different ones of the partial sets;
   the planes on which the partial sets are arranged being in a parallel relationship to each other or in a relationship wherein the partial sets do not intersect with each other at least on the conductors.

5. The circuit apparatus according to claim 1, further comprising
   a circuit block having R inputting and outputting portions each configured to output at least one signal to one module and/or input at least one signal generated in the one module, R being an integer greater than 1 but smaller than N which indicates the number of said modules, wherein:
   said function allocation section includes a module selection section configured to select R modules from among the N modules in response to the control signal inputted thereto and connect the selected R modules and R ones of said inputting and outputting portions of said circuit block in one-on-one corresponding relationship and besides connect one module selected in response to the control signal from among at least two modules individually to each of the R inputting and outputting portions;

each of said second power inputting sections inputs a power supply corresponding to at least one of the R inputting and outputting portions; and said connection section connects at least some of said first power inputting sections and said second power inputting section so that the power supply inputted by each of said plural second power inputting sections is supplied to the module connected to the inputting and outputting portion corresponding to the power supply.

6. The circuit apparatus according to claim 5, wherein the R inputting and outputting portions include R inputting and outputting portions from a first inputting and outputting portion to an Rth inputting and outputting portion;

the N modules including (R+1) modules from a first module to an (R+1)th module;

said module selection section selecting one of an ith module and an (i+1)th module in response to the control signal, said module selection section connecting the selected module to an ith inputting and outputting portion, i being an integer from 1 to R;

said connection section interconnecting that one of said second power inputting sections which inputs a power supply corresponding to the ith inputting and outputting portion and that one of said first power inputting sections which inputs a power supply to be supplied to that one of the ith module and (i+1)th module which is connected to the ith inputting and outputting portion.

7. The circuit apparatus according to claim 1, wherein said function allocation section sets a one-on-one corresponding relationship between the functions and said modules in response to voltages inputted to said first power inputting sections.

8. The circuit apparatus according to claim 7, further comprising a signal retaining section configured to retain a signal corresponding to the voltages inputted to said first power inputting sections in an initial state, wherein said function allocation section sets a one-on-one corresponding relationship between the functions and said modules in response to the signal retained by said signal retaining section.

9. A fabrication method for a circuit apparatus, comprising:

a first step of forming, on a common substrate or a plurality of substrates, a plurality of modules having functions which can be substituted for each other, a function allocation section configured to set a one-on-one corresponding relationship between a plurality of predetermined functions and said plural modules in response to a control signal inputted thereto and allocate the functions coordinated in accordance with the one-on-one relationship individually to said modules, and a plurality of first power inputting sections configured to input power supplies to be supplied to said modules;

a second step of forming a plurality of second power inputting sections each configured to input a power supply corresponding to at least one of the functions on the common substrate or the substrates;

a third step of inspecting the modules formed at the first step and determining functions to be allocated to the modules by the function allocation section in response to a result of the inspection; and a fourth step of forming a connection section configured to interconnect at least some of said first power inputting sections and said second power inputting sections so that each of the lower supplies inputted by said second power inputting sections is supplied to a module to which a function corresponding to the power supply is allocated based on the function allocation to the modules determined at the third step.

10. A fabrication method for a circuit apparatus according to claim 9, wherein the function allocation section is formed at the first step so that a redundant function is allocated to at least one of the modules; and the connection section is formed at the fourth step so that one of the first power inputting sections which is for inputting a power supply to the module to which the redundant function is allocated is connected to a predetermined reference potential line.

11. A fabrication method for a circuit apparatus according to claim 9, wherein the function allocation section is formed at the first step so that a one-on-one corresponding relationship between the functions and the modules is set in response to voltages inputted to the first power inputting sections.

* * * * *